US009000788B2

(12) United States Patent
Pagani

(10) Patent No.: US 9,000,788 B2
(45) Date of Patent: Apr. 7, 2015

(54) METHOD FOR PERFORMING AN ELECTRICAL TESTING OF ELECTRONIC DEVICES

(75) Inventor: Alberto Pagani, Nova Milanese (IT)

(73) Assignee: STMicroelectronics S.r.l., Agrate Brianza (IT)

(*) Notice: Subject to any disclaimer, the term of this patent is extended or adjusted under 35 U.S.C. 154(b) by 1156 days.

(21) Appl. No.: 12/625,188

(22) Filed: Nov. 24, 2009

(65) Prior Publication Data

US 2010/0134133 A1 Jun. 3, 2010

(30) Foreign Application Priority Data

Nov. 27, 2008 (IT) .............................. MI2008A2117

(51) Int. Cl.
*G01R 31/3187* (2006.01)
*G01R 31/317* (2006.01)

(52) U.S. Cl.
CPC ................................ *G01R 31/31713* (2013.01)

(58) Field of Classification Search
CPC . H04L 43/50; H04L 12/2697; H04L 41/0803; H01L 22/00
USPC ................. 324/750.3, 73.1, 754.01; 702/108, 702/117–119, 123; 714/27, 733
See application file for complete search history.

(56) References Cited

U.S. PATENT DOCUMENTS

| 5,202,639 | A * | 4/1993 | McKeon et al. ............... 324/537 |
| 6,646,461 | B2 * | 11/2003 | Sugiura et al. ............. 324/750.3 |
| 6,687,866 | B2 * | 2/2004 | Fukuda ......................... 714/733 |
| 6,717,430 | B2 * | 4/2004 | Burch ....................... 324/750.18 |
| 6,728,902 | B2 * | 4/2004 | Kaiser et al. .................... 714/30 |
| 6,825,683 | B1 * | 11/2004 | Berndt et al. ............... 324/750.3 |
| 7,032,141 | B2 * | 4/2006 | Tanizaki ....................... 714/718 |
| 7,375,541 | B1 * | 5/2008 | Chen et al. ................. 324/750.3 |
| 7,417,449 | B1 * | 8/2008 | Posey et al. ................ 324/750.3 |
| 7,679,391 | B2 * | 3/2010 | Watanabe et al. .......... 324/750.3 |
| 7,936,172 | B2 * | 5/2011 | Nordstrom et al. ........... 324/555 |
| 2003/0149946 | A1 * | 8/2003 | Devins et al. ..................... 716/4 |
| 2003/0197520 | A1 * | 10/2003 | Rearick et al. ................ 324/765 |
| 2004/0216061 | A1 * | 10/2004 | Floyd et al. ....................... 716/4 |

(Continued)

OTHER PUBLICATIONS

Liou et al., "A Prototype of a Wireless-Based Test System," IEEE, 2007, pp. 225-228.

(Continued)

*Primary Examiner* — Huy Q Phan
*Assistant Examiner* — Giovanni Astacio-Oquendo
(74) *Attorney, Agent, or Firm* — Seed IP Law Group PLLC

(57) ABSTRACT

A method of electrical testing electronic devices DUT, comprising: connecting at least an electronic device DUT to an automatic testing apparatus suitable for performing the testing of digital circuits or memories or of digital circuits and memories; sending electrical testing command signals to the electronic device DUT by means of the ATE apparatus; performing electrical testing of the electronic device DUT by means of at least one advanced supervised self testing system "Advanced Low Pin Count BIST" ALB which is built in the electronic device DUT, the ALB system being digitally interfaced with the ATE through a dedicated digital communication channel; and sending reply messages, if any, which comprise measures, failure information and reply data to the command signals from the electronic device DUT toward the ATE apparatus by means of the digital communication channel.

32 Claims, 22 Drawing Sheets

(56) References Cited

U.S. PATENT DOCUMENTS

2005/0229064 A1* 10/2005 Guidry .......................... 714/742
2006/0242504 A1* 10/2006 Kadota ......................... 714/725
2006/0282326 A1* 12/2006 Lombardi ...................... 705/14
2006/0282626 A1* 12/2006 Fin .............................. 711/154
2007/0096759 A1   5/2007 Weinraub
2007/0216438 A1   9/2007 Gupta et al.

OTHER PUBLICATIONS

Sweeney et al., "Reducing Test Cost Through the Use of Digital Testers for Analog Tests," IEEE International Test Conference, 2005, pp. 1-9.

* cited by examiner

METHOD FOR PERFORMING AN ELECTRICAL TESTING OF ELECTRONIC DEVICES

BACKGROUND

1. Technical Field

The present disclosure relates to methods for performing an electrical testing of electronic devices.

The present disclosure also relates to systems for performing the electrical testing of electronic devices.

2. Description of the Related Art

At present to perform an electrical wafer sort (EWS) testing of an electronic device to be tested or Device Under Testing (DUT), it is necessary to electrically connect a testing apparatus or tester, such as an Automatic Test Equipment (ATE), with the wafer comprising a plurality of electronic components to be selected. In particular, a probe card is used, comprising at least one probe or more generally a plurality of probes, acting as an interface between the ATE and the wafer. The probe card is a board comprising a printed circuit or Printed Circuit Board (PCB) and several dozens (often even several hundreds) of probes which electrically connect the ATE with most of the electrical terminations or pads of the device to be tested. In fact, the ATE comprises measurement or testing resources which should be connected with all the pads being necessary to perform the testing, and the number of pads for performing the testing can be lower or equal to the number of pads on the device. ATE measurement or testing resources are composed for example of power supplies, signal generators, measurement instruments, computation and processing instruments, etc. By way of example, the attached FIG. 1 shows a device DUT 10, comprising a plurality of pads 11 connected with an ATE, not shown in the figure, by means of a plurality of probes 12 of a probe card, not shown in the figure too.

This kind of method is also adopted for performing, on an electronic device DUT, a final test, for which one or more chips are encapsulated in a single package, which will be connected for example to a plurality of pogo pins of a socket so that an ATE performs the final test thereof.

Similarly, for testing a generic complex electronic system by using an ATE, the resources thereof are connected to the circuits of the electronic system to be tested by means of pads, if it is a question of testing on-wafer chips, or by means of bumps or leads, if the chips are also encapsulated in a package or if the chips are on a wafer comprising the bumps (created for example on pads), or, in general, by means of suitable connectors already comprised in the circuits realized according to the prior art.

The testing of complex on-wafer DUTs performed by using this kind of method is considerably complicated since several testing operations generally should be performed and the wafer should be thus necessarily contacted several times.

Moreover, the use of probes connecting the ATE with the wafer often involves the damaging of the selected device pads, complicating the further device assembly.

Furthermore, performing the testing of several parallel-connected DUT requires the use of probe cards with a very high number of probes, increasing contacting problems and thus of electrical continuity between the probes of the probe card and the DUT pads and also causing problems of electrical yield loss. It should be also said that the number of ATE resources to be used increases according to the number of pads to be contacted on the DUT to be tested and, consequently, the number of DUTs which can be tested in parallel decreases, inevitably increasing testing costs.

A device DUT to be tested can be composed of at least one generic and anyhow complex electronic device or of a set of integrated electronic circuits being encapsulated in a package, or System in Package (SiP), or even of a generic anyhow complex electronic system. Moreover, a device DUT can comprise analog and radio frequency (RF) circuits, digital circuits and one or more different kinds of memories, and various combinations thereof. By way of example, the attached FIG. 2 shows a generic complex device DUT 100 comprising a memory block 103 (for example a Flash memory), an analog circuit block 104, a digital circuit block 105 and a RF circuit block 106. A similar device is generally defined as mixed-signal since it comprises both analog and digital signals and also radio frequency signals.

At present, especially for DUTs being used in the automotive field, performing the testing of devices DUT of such a complex type requires two or more testing operations and, thus, the use of at least two different types of ATE with different temperature conditions. Consequently, the electrical selection process is considerably complicated. In fact, for complex DUT testing, it is necessary to have ATEs of different type and high cost, besides solving production problems due to the analog and RF circuits in the DUT.

For example, as shown in the attached FIG. 3, for performing the testing of the digital block 105 it is necessary to use a specific ATE 107 for the digital testing, which is connected to one part of the DUT resources. For such a testing scanning techniques are usually implemented, i.e., the device is provided with scan cells at the device edge to be able to perform the boundary scanning (for pins) and/or with internal scan cells (for nodes), being series-connected to form scanning chains or scan chains.

For the testing through scan chains suitable Advanced Test Pattern Generator (ATPG) software is often required, generating test patterns at the DUT input. These patterns, called input test vectors, are loaded along the chains in order to stimulate the device internal circuits. In response, output test vectors are generated, being captured by scan cells and then outputted in order to compare them with the expected testing results. This technique thus requires the availability in the ATE of expensive and complex resources, being necessary to store and apply input test vectors and then to compare them with the expected results.

At present, a technique being frequently used and effective for this purpose is scan compression, which reduces by a factor even higher than 10 the number of scan chains to be connected to the digital tester.

Alternatively, boundary scanning techniques are also used, being based on a suitable architecture and design rules being described in the IEEE/ANSI 1149 standard, allowing chips to have a common interface and a testing protocol providing a standard solution.

The digital testing can be performed by using Low Pin Count (LPC) interfaces being useful to reduce the number of pins to be contacted for performing the testing. Nevertheless, the LPC interfaces being used to reduce the number of pads to be contacted are useful only for testing digital DUTs or DUTs being mostly composed of digital circuits. Consequently, in order to allow these LPC testing interfaces to be used it is necessary to insert, in the device, dedicated circuits which disadvantageously occupy a certain device area.

Techniques of the Built In Self Test (BIST) type also are used for performing digital circuit testing, providing that BIST test circuits are integrated within the device and they can test it, given that these circuits add testing resources within the DUT, releasing as much as possible from the ATE. In this sense, for example in the digital circuit case, input test vectors are generated within the DUT, so that the testing occurs inside it and a given circuit block tests itself. In particular, suitable signals are generated on DUT inputs by BIST circuits, for example by means of Linear Feedback Shift Register (LFSR) circuits, while outputs are combined in a datum, called signature. The circuit block to be tested is failure-free if the outputs generate the expected signature. The disadvantage of the structure created by BIST circuits is the unsuitable performance in terms of failure coverage in the case of a generic circuit which can be not completely digital.

Moreover, as shown in the attached FIG. 4, for performing the testing of the memory block 103 a specific ATE 108 for the memory testing is used, by connecting it to a part of the DUT itself. In particular, for testing DUT memory circuits Memory BIST techniques are presently used, or other testing techniques based on the specific kind of memory and on the physics of the memory base element, such as flash memories. In this case too, LPC interfaces are used, reducing the number of pins to be contacted for performing the testing. More in detail, with the flash memory BIST technique, the chip can be inside tested by means of a Core or a microcontroller which can be arranged to perform a firmware code (FW), which is sent from the ATE to the chip by means of a LPC dedicated interface. The advantages of this technique are the possibility to simplify the ATE increasing the testing parallelism and considerably reducing testing costs. Nevertheless, disadvantageously, for performing the testing of non volatile memories (NVM), for example of the flash type, it is necessary to perform two testing flows, since also the retention test of Floating Gate Avalance Metal Oxide Semiconductor (FAMOS) memory cells should be performed.

It is also possible to perform the testing of digital circuits and of memory circuits with a same ATE. In fact, as it is evident from the attached FIG. 5, a specific ATE 109 for the testing of the digital block 105 and of the memory block 103 is used, by connecting one part of the DUT 100, in particular digital and memory blocks, to the resources of ATE 109. In particular, this kind of testing is performed by using some of the above-described techniques.

Similarly, for performing the testing of digital and analog circuits a specific ATE 110 for the testing of mixed-signal circuits is used, or both analog and digital signals, by connecting one part of the DUT 100, in particular digital and analog blocks, to the resources of ATE 110, as shown in the attached FIG. 6. For this kind of mixed-signal testing, dedicated circuits and specific testing methods are usually used, which can sometimes make use of the so-called Intellectual Properties (IPs), according to the specific circuit to be tested. These IPs are composed of particular circuit being able to perform or to enable a testing which is generally but not exclusively of the BIST type. Nevertheless, a disadvantage of this king of testing is that mixed-signal ATEs have a cost which is generally very high and anyhow higher than other kinds of ATE.

For the testing of radio frequency circuits (RF) a specific ATE 111 should be used, by connecting one part of the DUT, in particular radio frequency circuits, to the resources of ATE 111, as shown in the attached FIG. 7. Nevertheless, performing this kind of testing has several problems. For DUTs comprising circuits of the analog and/or RF type, it is very difficult to reduce the number of resources to be contacted, and it is usually necessary to connect the DUT with all ATE resources referring to these circuits. Consequently, ATEs being used are considerably complex and very expensive. Moreover, the presence of analog and RF circuits in the DUT makes the testing difficult because of the several parasitic phenomena in the electrical measurement chain between the DUT and ATE internal instruments.

As shown in the attached FIG. 8, it is possible to perform together the testing of digital, analog and RF circuits, by using a specific ATE 112 for the testing of mixed-signal circuits having therein also specific instruments for RF testing, by connecting one part of the DUT, in particular analog 104, digital 105 and RF 106 blocks, to ATE resources. For performing this kind of testing specific IPs and the above-disclosed techniques are usually used.

Thus, in general, each DUT requires a particular electrical selection or testing process. Thus, finding out a standard testing approach, able to reduce the number of ATEs of different kind to be used for the testing and, consequently, the costs, the complexity of testing flows and of the productive process in general, is a big problem.

A solution for reducing the testing cost of mainly digital chips with some analog circuits is described in the article "Reducing Test Cost Through the use of digital Testers for Analog Tests", proposed by IBM at the conference IEEE-ITC 2005. In this article, instead of using mixed-signal ATEs having high costs an alternative solution has been chosen, comprising the use of digital ATEs, being available at low cost, adding between the digital ATE and the DUT, a specific interface board, Device Interface Board (DIB), having the resources being necessary for the analog circuit testing. The attached FIG. 9 shows the digital ATE 107, of the type shown in FIG. 3, connected to a DIB board 113 communicating with two devices DUT 200, just acting as an interface between the ATE and the two DUTs. More in detail, the attached FIG. 10 shows the digital ATE 107 connected to the DIB board 113, interfaced with on-wafer DUTs 200 by means of a probe card 114.

The solution being described in the above-mentioned article is effective for mixed-signal DUTs with a low content of analog circuits, while it could be hardly applied to mixed-signal DUTs with a considerable analog part since, in this case, the DIB board would become very complex and expensive. Moreover, the DIB board being described is a dedicated interface to the specific DUT, generally not reusable for other kinds of DUT.

BRIEF SUMMARY

The disclosure relates to electrical testing methods of electronic devices, for example, of the type comprising at least one electrical selection step of wafers chosen, for example, between a testing of the Electrical Wafer Sort (EWS) type or of the final test type or even a System in Package (SiP) encapsulated device testing, or even a testing of the Wafer Level Burn-In (WLBI) type, performed with stress and high temperature, or even a testing of complex electronic systems, and the following description is made with reference to this field of application for convenience of illustration only.

In an embodiment, a method of electrical testing of an electronic device comprises an integrated advanced supervised self testing system "Advanced Low Pin Count BIST" (ALB). The ALB system comprises a plurality of circuits Built-In Self Test (BIST) and a digital interface Low Pin Count (LPC), suitable to connect the DUT to a digital ATE. The digital ATE is structured to send command signals and software instructions to the DUT, inside performing these commands and instructions and sending to the ATE reply messages comprising measures, data representing error codes and other information concerning possible failures.

In an embodiment, a method of performing an electrical testing of electronic devices DUT, comprises the steps of:
- connecting at least an electronic device DUT to an automatic testing apparatus or ATE apparatus suitable for performing the testing of digital circuits or of memories, or of digital circuits and memories;
- sending electrical testing command signals to the electronic device DUT by means of the ATE apparatus;

the method being characterized in that it further comprises the steps of:
- performing electrical testing of the electronic device DUT by means of at least one advanced supervised self testing system of the "Advanced Low Pin Count BIST" or ALB system which is built in the electronic device DUT, the ALB system being digitally interfaced with the ATE apparatus through a dedicated digital communication channel and comprising a limited number of communication or connection lines dedicated to the self testing information exchange; and
- sending reply messages, if any, which comprise measures, failure information and reply data to the command signals from the electronic device DUT toward the ATE apparatus by means of the digital communication channel.

In an embodiment, the communication or connection lines are chosen in the group constituted by:
- wired lines;
- wireless lines;
- partially wired and partially wireless lines.

In an embodiment, the communication or connection lines are a plurality of internal lines of the electronic device DUT, and in case they transmit and receive data chosen in the group constituted by:
- 4-bit data (nibbles);
- 8-bit data (bytes);
- 16-bit data (words), the communication lines are input and output gates within the electronic device DUT.

Furthermore, the method according to an embodiment also comprises a step chosen between:
- a generation step of a clock signal being performed inside the electronic device DUT in order to guarantee the synchronization between the electronic device DUT and the ATE apparatus; and
- a transmission step of analog data related to measures which have been executed within the electronic device DUT toward the ATE apparatus by means of the communication lines, the analog data having been previously converted into digital data by means of an Analog-to-Digital converter inside the electronic device DUT.

In an embodiment, the step of performing the electrical testing is performed by at least one circuit which is structured to perform the testing and integrated in the electronic device DUT or by using a first circuit of the device DUT which is functionally similar to the structured circuit to perform the testing together with a second testing circuit which is integrated in the device DUT, the first and second circuits together carrying out the same function as the structured circuit.

In an embodiment, the method comprises a step chosen between:
- an activation step of the first circuit in user mode; and
- an activation step of the second circuit in test mode which is performed through a system chosen in the group constituted by:
  - at least one control digital line
  - at least one flip-flop.

Embodiments of the method may be used, for example, for an on-wafer electronic device DUT, or for an electronic device DUT being encapsulated in a package, or also for an electronic device DUT comprising at least one MEMS device.

In an embodiment the step of performing the electrical testing of the electronic device DUT comprises performing testing of a set or subset of:
- at least one analog circuit block,
- at least one digital circuit block,
- at least one radio frequency circuit block,
- at least one memory circuit block,
- at least one mixed-signal circuit block,
- at least one MEMS device;
- at least one circuit block which is different from the above-cited ones, the blocks being comprised in the electronic device DUT.

The step of performing electrical testing can also comprise the steps of:
- performing perhaps a continuity test to verify the correct working of the wired communication or connection lines between the electronic device DUT and a remaining part of the testing system;
- performing perhaps a transmission-reception test to verify the correct working of wireless communication or connection lines between the electronic device DUT and a remaining part of the testing system;
- performing parametric testing to measure at least one parameter between a voltage or a current of the electronic device DUT;
- performing in series and concurrently, or partially in series and partially concurrently, the testing of a set or subset of:
  - at least one digital circuit block,
  - at least one memory circuit block,
  - at least one analog circuit block,
  - at least one mixed-signal circuit block
  - at least one radio frequency circuit block;
  - at least one MEMS device;
  - at least one circuit block which is different from the above-cited ones in any sequence, with possibility of repetition;
- performing testing related to the working of the electronic device DUT.

In an embodiment, performing the electrical testing can also comprise performing testing with stress and high temperature, according to the Wafer Level Burn-In (WLBI) type.

In an embodiment, at least one of the testing is performed partially inside and partially outside the electronic device DUT, in case by processing data by means of hardware and/or software resources of the ATE apparatus.

In an embodiment, an electronic device to be electrically tested DUT and of the type suitable to be connected to an automatic testing apparatus or ATE apparatus suitable for performing the testing of digital circuits or memories, or of digital circuits and memories, the ATE apparatus being able to send electrical testing command signals to the electronic device DUT, the device being characterized in that it comprises at least one advanced supervised self testing system "Advanced Low Pin Count BIST" or ALB system which is suitable for digitally interfacing with the ATE apparatus through a dedicated digital communication channel and comprising a limited number of communication or connection lines to send reply messages, if any, comprising measures, failure information and reply data to the command signals toward the ATE apparatus and by means of the digital communication channel.

In an embodiment, the ATE apparatus is a digital one.

In an embodiment, the device comprises a set or subset of
at least one digital circuit block,
at least one memory circuit block,
at least one radio frequency circuit block,
at least one MEMS device;
at least one analog circuit block;
at least one mixed-signal circuit block;
at least one electromagnetic interface;
at least one optoelectronic interface;
at least one circuit block which is different from the above-cited ones.

In an embodiment, the ALB system comprises:
a plurality of Built In Self Test circuits comprising a set or subset of:
  at least one circuit for testing the at least one analog circuit block;
  at least one circuit for testing the at least one digital circuit block;
  at least one circuit for testing the at least one radio frequency circuit block;
  at least one circuit for testing the at least one memory circuit block;
  at least one circuit for testing the at least one mixed-signal circuit block;
  at least one circuit for testing the at least one MEMS device;
  at least one circuit for testing the at least one circuit block which is different from the above-cited ones;
  at least one digital interface circuit block, suitable for connecting the electronic device DUT with the ATE apparatus.

In an embodiment, the digital interface circuit block comprises at least one of the following interfaces:
a digital interface of the Low Pin Count type;
a digital interface of the serial type;
a digital interface of the JTAG type.

Furthermore the digital interface circuit block can comprise a set or subset of:
at least one wired communication line;
at least one wireless communication line;
at least one wired communication line and at least one wireless communication line
at least one communication line which is different from the above-cited ones.

Furthermore the digital interface circuit block can comprise in case at least one wireless line composed of an electromagnetic or optoelectronic interface comprising a set or subset of:
at least one reception circuit
at least one transmission circuit
at least one antenna
at least one optoelectronic device
and the electromagnetic or optoelectronic interface is suitable for exchanging information with another electromagnetic or optoelectronic interface connected to the ATE apparatus.

In an embodiment, the ALB system comprises at least one control circuit interconnected between the at least one digital interface circuit block and the plurality of Built in Self Test circuits, the control circuit being able to supervise the electronic device DUT during a testing step.

In an embodiment, the control circuit comprises one between:
a programmable state machine;
a microcontroller and in case a memory connected thereto;
or
a processing core and in case a memory connected thereto, the memory being dedicated or already comprised into the ALB system.

In an embodiment, the memory includes the command signals, the command signals are executed by the core and by the plurality of Built in Self Test circuits, the BIST circuits are suitable for returning the result of the testing step to the ATE apparatus, with the details of the testing itself, and the details can be converted into a digital form.

In an embodiment, the ALB system can be a firmware system which can be changed by means of a software code and the at least one mixed-signal circuit block can comprise at least one circuit ADC, in case of the $\Sigma\Delta$ type or at least one PLL.

In an embodiment, the electronic device DUT can be encapsulated in a package.

In an embodiment, the device may comprise:
at least one first electronic device DUT and
at least one second electronic device DUT
each comprising at least one advanced supervised self testing system "Advanced Low Pin Count BIST" or ALB system,
the at least one first and second device DUT being connected to an internal circuit network of the electronic device DUT suitable for connecting it to an ATE apparatus.

Furthermore, in an embodiment the ATE apparatus is a digital one and the internal connection circuit network further comprises at least one third device DUT, in turn comprising an ALB system, the at least one third device DUT acting as a supervisor of the electronic device DUT.

Furthermore, an embodiment can further comprise at least one DAC (Digital to Analog Converter) to create at least one analog signal inside the DUT for the testing, starting from a sequence of digital information sent by the ATE apparatus.

Further features and advantages of embodiments of the method and device will be apparent from the following description, given by way of non limiting examples with reference to the attached drawings.

In an embodiment, a method of testing electronic devices DUT comprises: connecting, using a dedicated digital communication channel, at least one electronic device DUT to an automatic testing apparatus ATE configured to perform testing of at least one of digital circuits and memories; sending electrical testing command signals to the at least one electronic device DUT from the ATE through the dedicated digital communication channel; loading the electrical testing command signals in the at least one electronic device DUT; performing electrical testing of the at least one electronic device DUT using the at least one electronic device DUT and based on the loaded electrical testing command signals; and sending reply messages from the at least one electronic device DUT to the ATE through the dedicated digital communication channel. In an embodiment, the method further comprises: generating a clock signal in the at least one electronic device DUT; and synchronizing the at least one electronic device DUT and the ATE based on the generated clock signal. In an embodiment, the at least one electronic device comprises at least one ADC (Analog to Digital Converter), the method further comprising: converting analog data to digital data using the at least one ADC; and transmitting the converted analog data from the at least one electronic device DUT to the ATE through the dedicated digital communication channel. In an embodiment, the performing electrical testing is performed by at least one circuit which is structured to perform the testing and is integrated into the at least one electronic device DUT. In an embodiment, the performing electrical testing is performed by using a first circuit of the electronic device DUT which is functionally similar to a structured circuit to perform the testing together with a second testing circuit which is integrated into the electronic device DUT, the first and second circuits together carrying out a same function as a function of the structured circuit. In an embodiment, the at least one electronic device comprises user mode circuitry and test mode circuitry, the method further comprising configuring a first functional block of the user mode circuitry and a second functional block of the test mode circuitry to jointly perform a test mode function. In an embodiment, the method further comprises: an activation step of the first functional block in user mode. In an embodiment, the method further comprises: an activation step of the second functional block in test mode using at least one of a control digital line and a flip-flop. In an embodiment, the performing electrical testing comprises: performing at least one of a continuity test and a transmission-reception test to verify communication with the at least one electronic device DUT; performing parametric testing to measure at least one of a voltage or a current of the at least one electronic device DUT; performing the testing of at least one of: a digital block; a memory block; an analog block; a mixed signal block; a radio frequency block; and a MEMS device; and performing testing steps related to a working of the at least one electronic device DUT. In an embodiment, at least some of the testing steps are carried out in parallel. In an embodiment, the performing electrical testing comprises performing stress and temperature changes testing of a wafer level burn-in. In an embodiment, at least one testing step is performed partially inside and partially outside the electronic device DUT. In an embodiment, the at least one testing step is performed by processing data by means of hardware and/or software resources of the ATE apparatus.

In an embodiment, an electronic device comprises: at least one functional module; a digital signal interface configured to communicatively couple the electronic device to an automatic testing apparatus through a dedicated digital communication channel; and a testing module communicatively coupled to the digital signal interface and configured to: load digital electrical testing command signals received from the automatic testing apparatus; test the at least one functional module based on the loaded digital electrical testing command signals; and send testing result digital signals to the digital signal interface for transmission to the automatic testing apparatus. In an embodiment, the at least one functional module comprises at least one of: a digital block; a memory block; a radio frequency block; a MEMS device; an analog block; and a mixed signal block. In an embodiment, the digital signal interface comprises at least one of: an electromagnetic interface; an optoelectronic interface; and a digital signal bus interface. In an embodiment, the testing module comprises a plurality of built-in-self-test modules comprising at least one of: a module configured to test an analog functional block of the electronic device; a module configured to test a digital functional block of the electronic device; a module configured to test a radio frequency functional block of the electronic device; a module configured to test a memory of the electronic device; a module configured to test a mixed signal block of the electronic device; and a module configured to test a MEMS device of the electronic device. In an embodiment, the digital signal interface comprises at least one of: a digital interface of a low pin count type; a digital interface of a serial type; and a digital interface of a JTAG type. In an embodiment, the testing module comprises: a plurality of built-in-self-test modules; and a controller coupled to the digital signal interface and the plurality of built-in-self-test modules and configured to control set up of a testing mode of the electronic device. In an embodiment, the testing module comprises at least one of: a programmable state machine; a microcontroller and a memory coupled to the microcontroller; a processing core and a memory coupled to the processing core; and firmware configured to be modifiable by the digital electrical testing command signals. In an embodiment, the electronic device further comprises: a memory; and a processor core, wherein: the testing module comprises at least one built-in-self-test module; the memory is configured to store the digital electrical testing command signals; the processor core and the at least one built-in-self-test module are configured to execute the stored command signals; and the at least one built-in-self-test module is configured to generate the testing result digital signals. In an embodiment, the memory is a memory of the functional module of the electronic device.

In an embodiment, a system comprises: an automatic testing apparatus configured to generate digital test command signals; and a plurality of electronic devices, each having: at least one functional module; a digital signal interface configured to communicatively couple the electronic device to the automatic testing apparatus; and a testing module communicatively coupled to the digital signal interface and the at least one functional module and configured to set up a test mode of operation of the electronic device based on the digital test command signals. In an embodiment, the plurality of electronic devices each further comprises at least one digital to analog converter configured to create at least one analog signal in the corresponding electronic device based on the digital test command signals.

In an embodiment, an electronic device comprises: at least one functional module; a digital signal interface configured to communicatively couple the electronic device to an automatic testing apparatus through a dedicated digital communication channel; and a testing module communicatively coupled to the digital signal interface and configured to: set up a test mode of operation of the electronic device based on digital electrical testing command signals received from the automatic testing apparatus; test the at least one functional module; and send testing result digital signals to the digital signal interface for transmission to the automatic testing apparatus. In an embodiment, the electronic device further comprises: a digital to analog converter configured to generate an analog signal in the electronic device during the testing of the at least one functional module. In an embodiment, a computer-readable memory medium contents cause an electronic device to perform a method, the method comprising: configuring a test mode of operation of the electronic device based on digital test command signals received from an automatic testing apparatus; testing the electronic device in the test mode of operation; and transmitting digital test result signals to the automatic testing device. In an embodiment, the configuring the test mode of operation comprises configuring the electronic device to generate an analog signal in the test mode of operation.

In an embodiment, a method of testing an electronic device comprises: transmitting digital test command signals to the electronic device; configuring, under control of the electronic device, a test mode of operation of the electronic device based on the digital test command signals; testing the electronic device in the test mode of operation; and transmitting digital test result signals from the electronic device based on the testing of the electronic device. In an embodiment, the testing the electronic device in the configuration mode comprises generating an analog signal in the electronic device.

DETAILED DESCRIPTION

Figure 1:
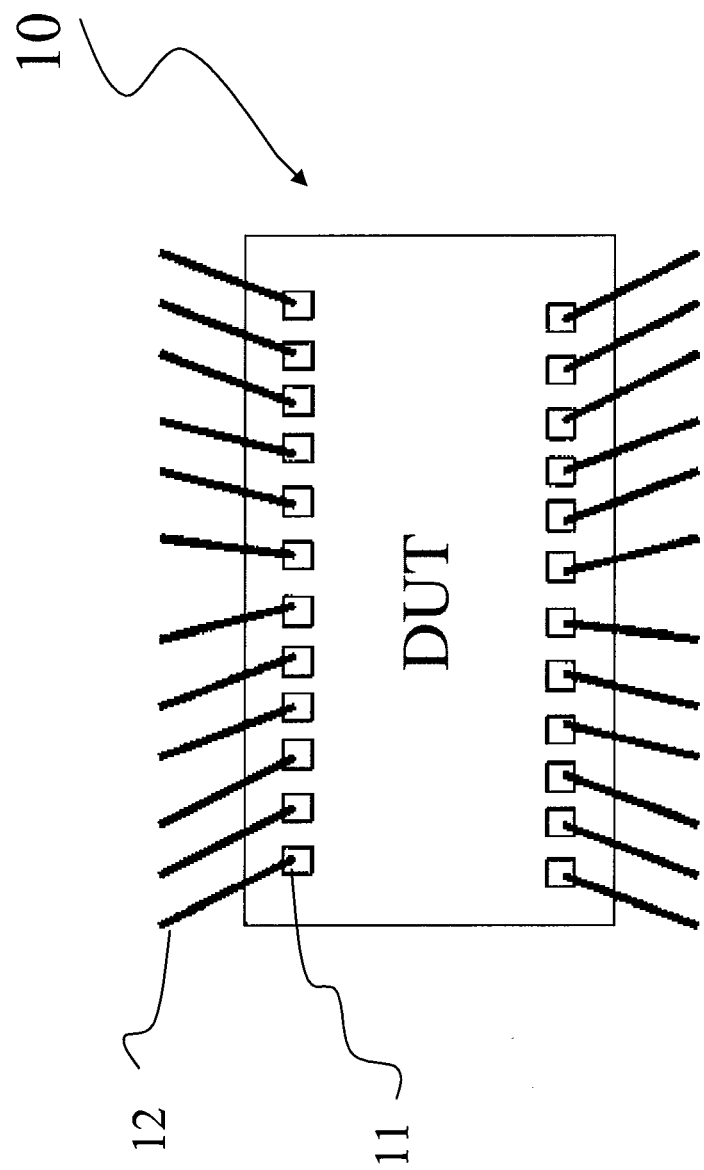
FIG. 1 is a view from above of a device DUT to be tested by means of a probe card, according to the prior art.
Figure 2:
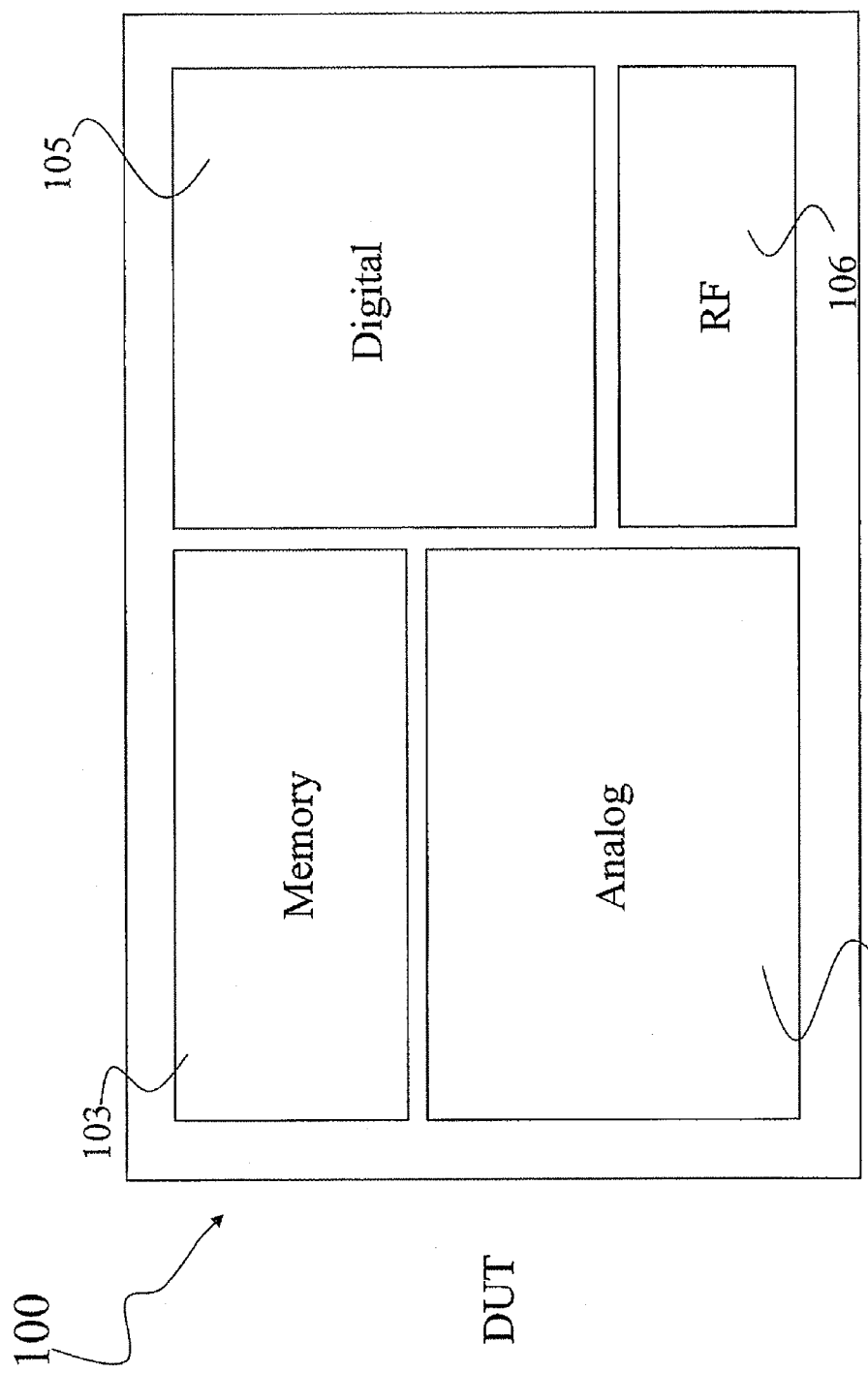
FIG. 2 is a schematic view from above of a complex device DUT, according to the prior art.
Figure 3:
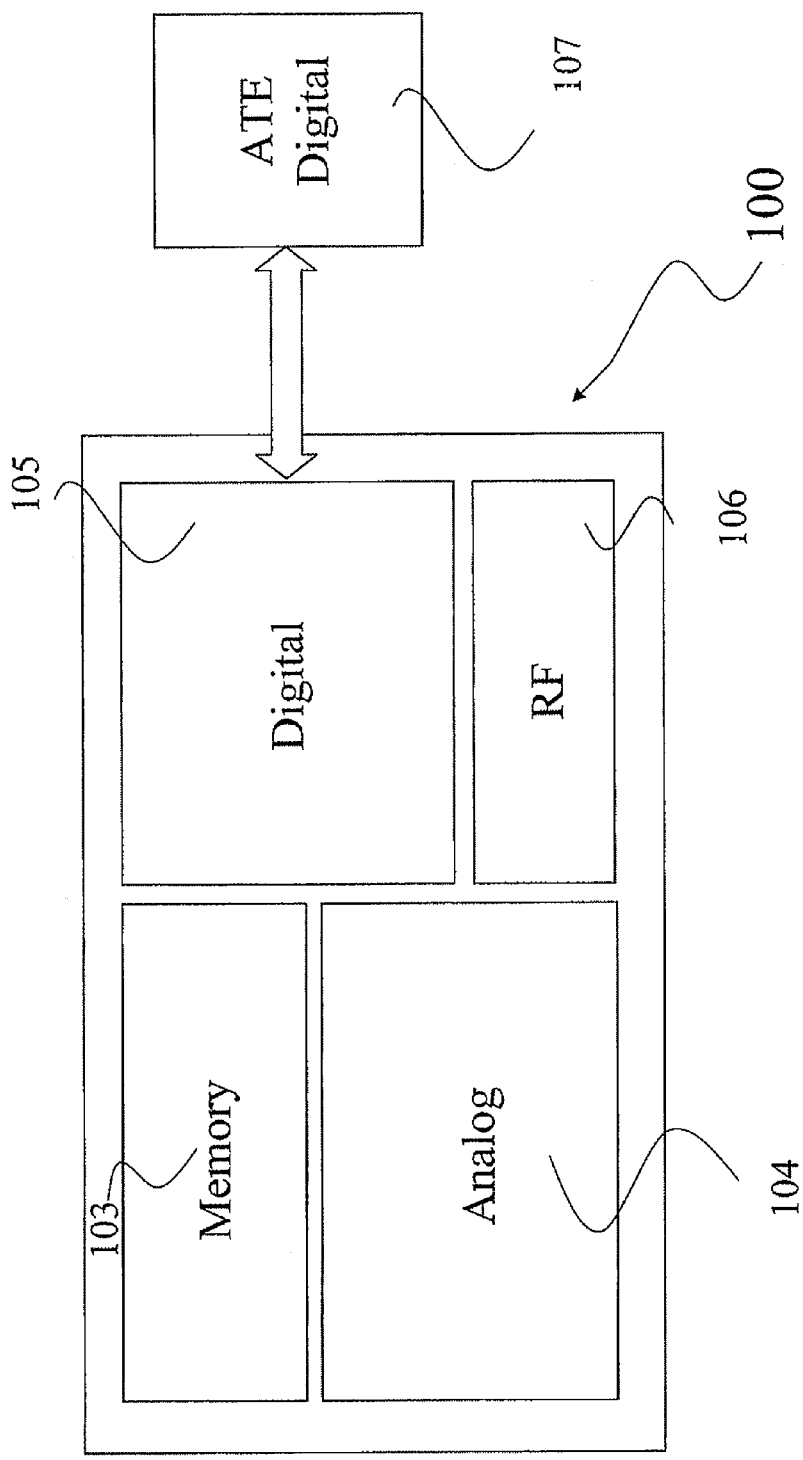
FIG. 3 is a schematic view from above of the complex device DUT connected to a digital ATE, according to the prior art.
Figure 4:
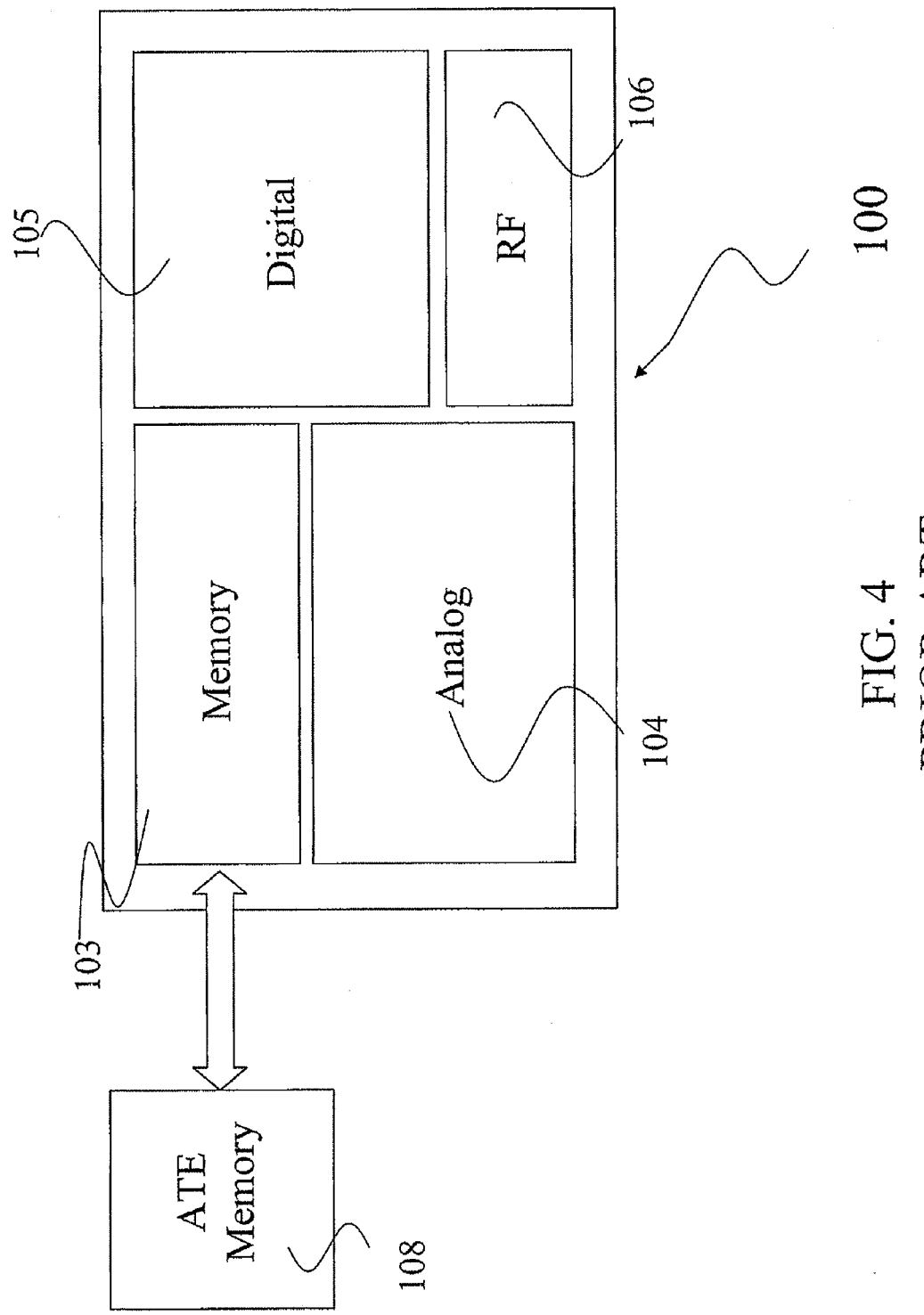
FIG. 4 is a schematic view from above of the complex device DUT connected to a specific ATE for memory testing, according to the prior art.
Figure 5:
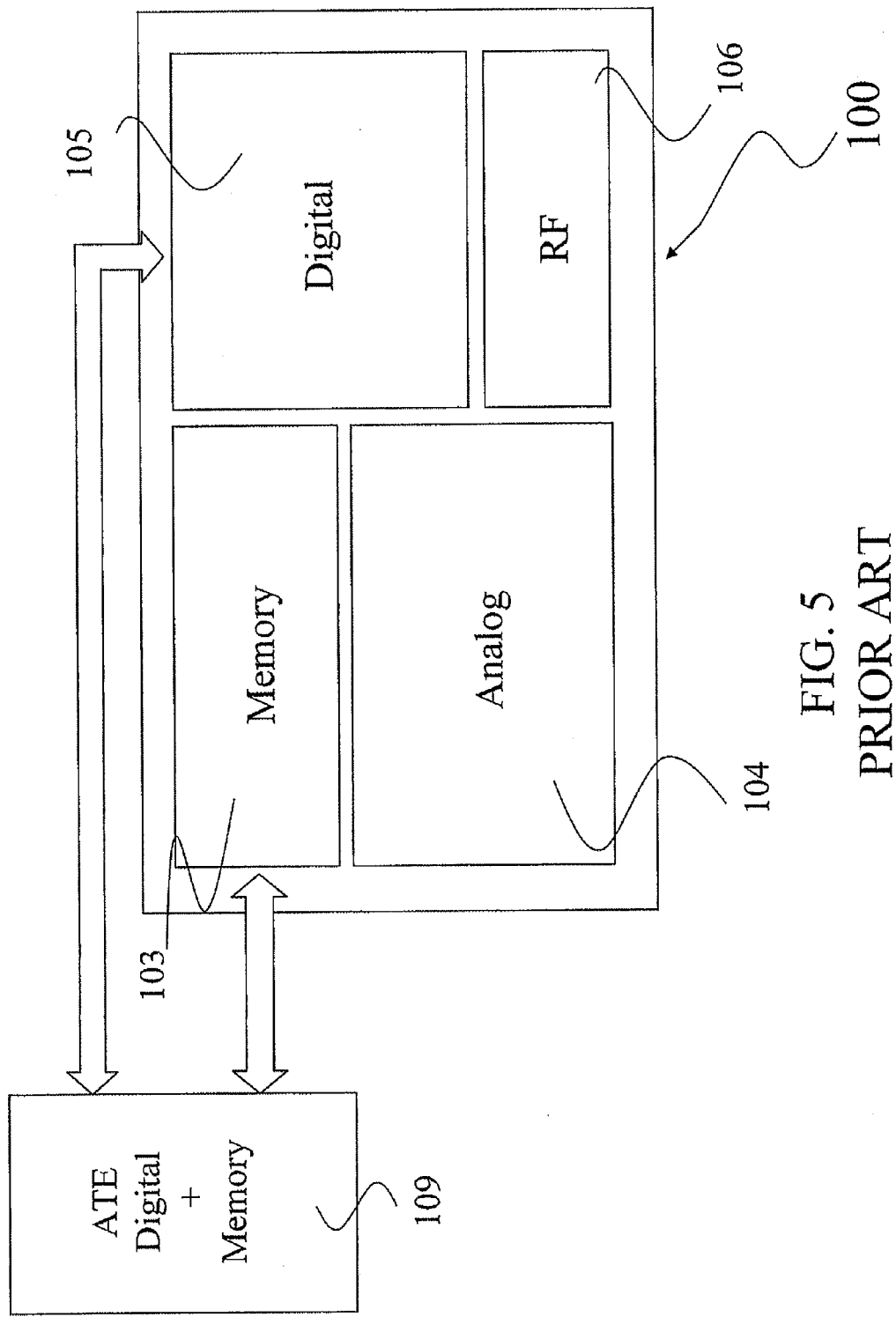
FIG. 5 is a schematic view from above of the complex device DUT connected to a specific ATE for the digital testing and of memories, according to the prior art.
Figure 6:
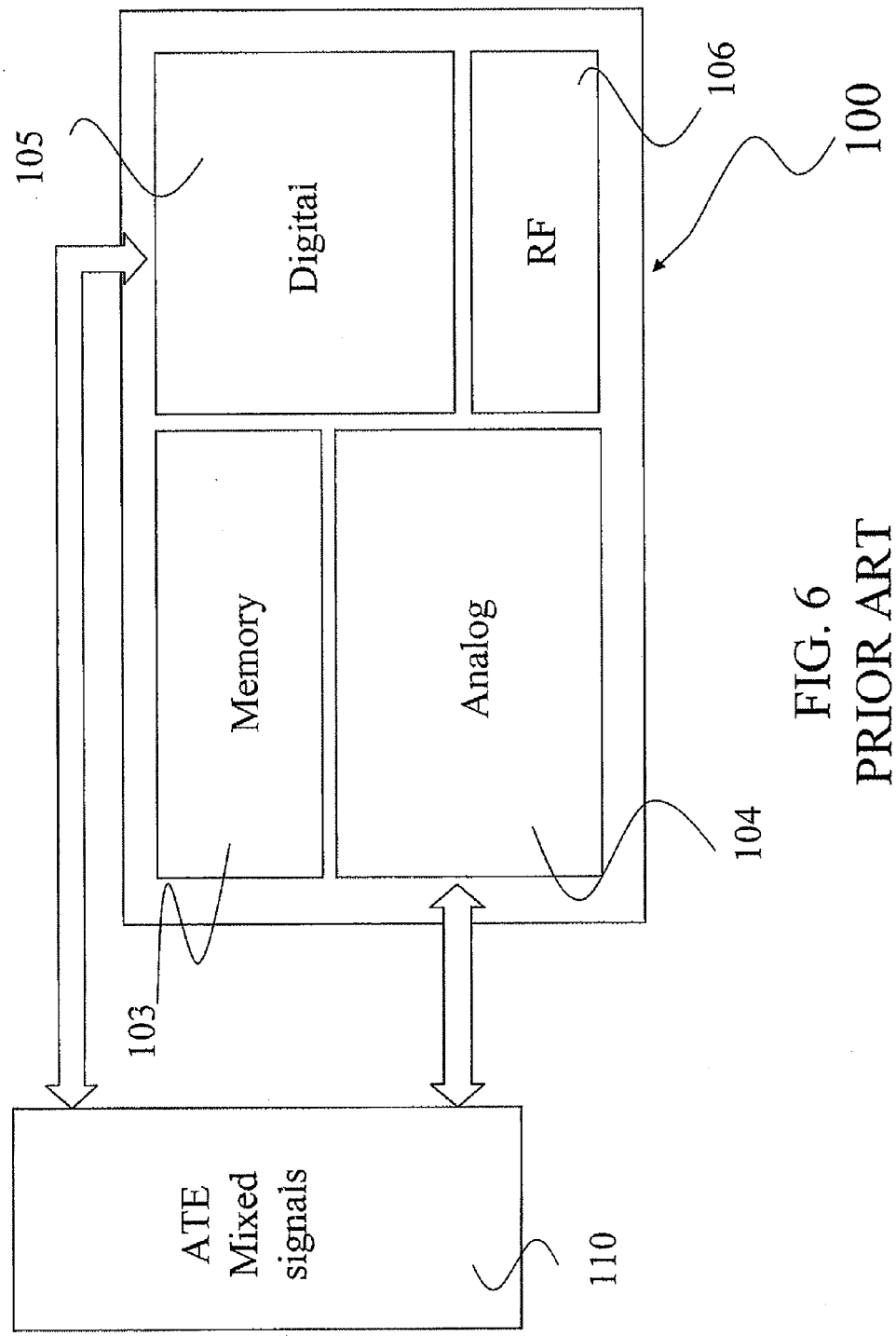
FIG. 6 is a schematic view from above of the complex device DUT connected to a specific ATE for the testing of mixed-signal circuits, according to the prior art.
Figure 7:
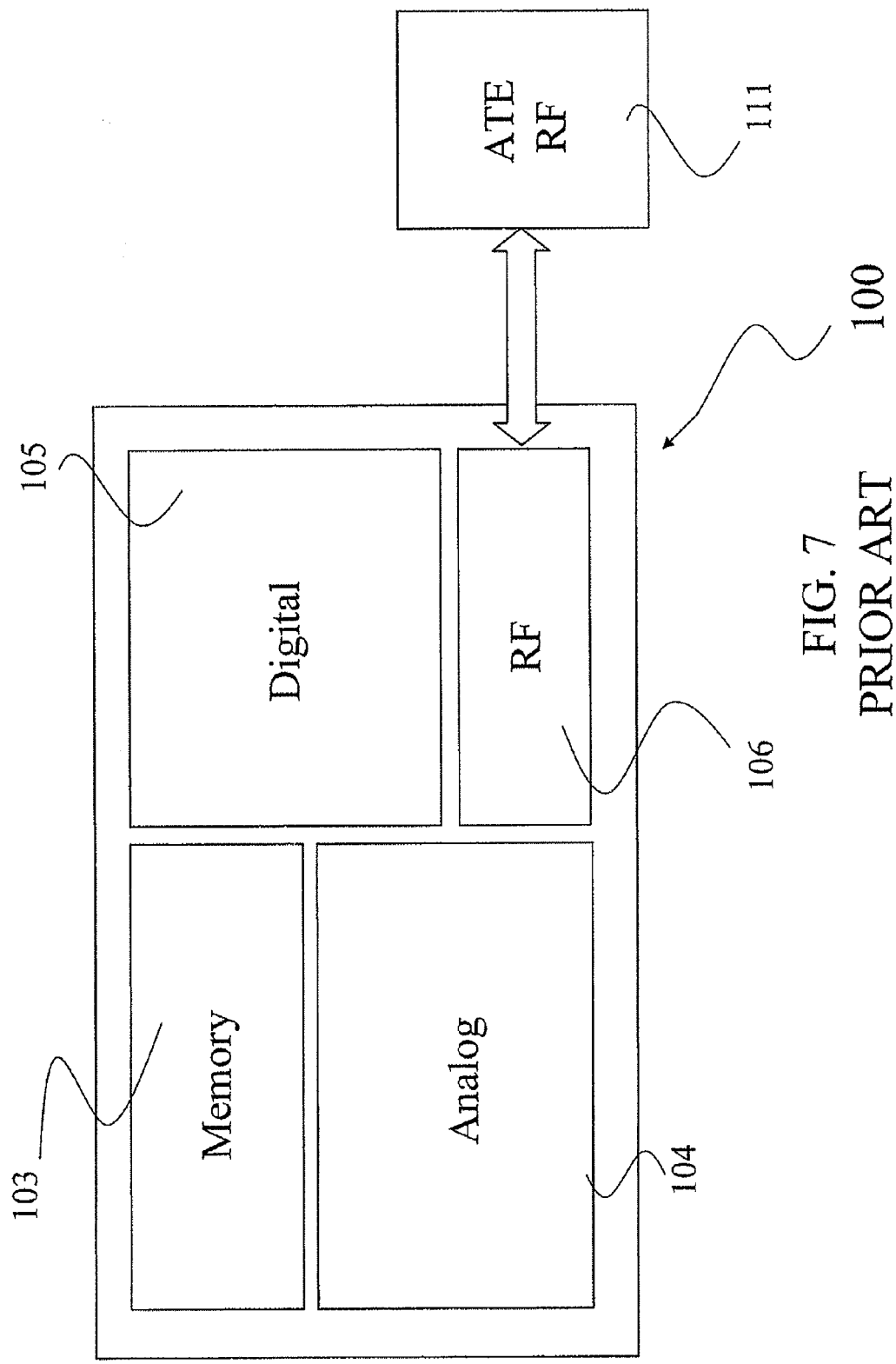
FIG. 7 is a schematic view from above of the complex device DUT connected to a specific ATE for the testing of radio frequency circuits, according to the prior art.
Figure 8:
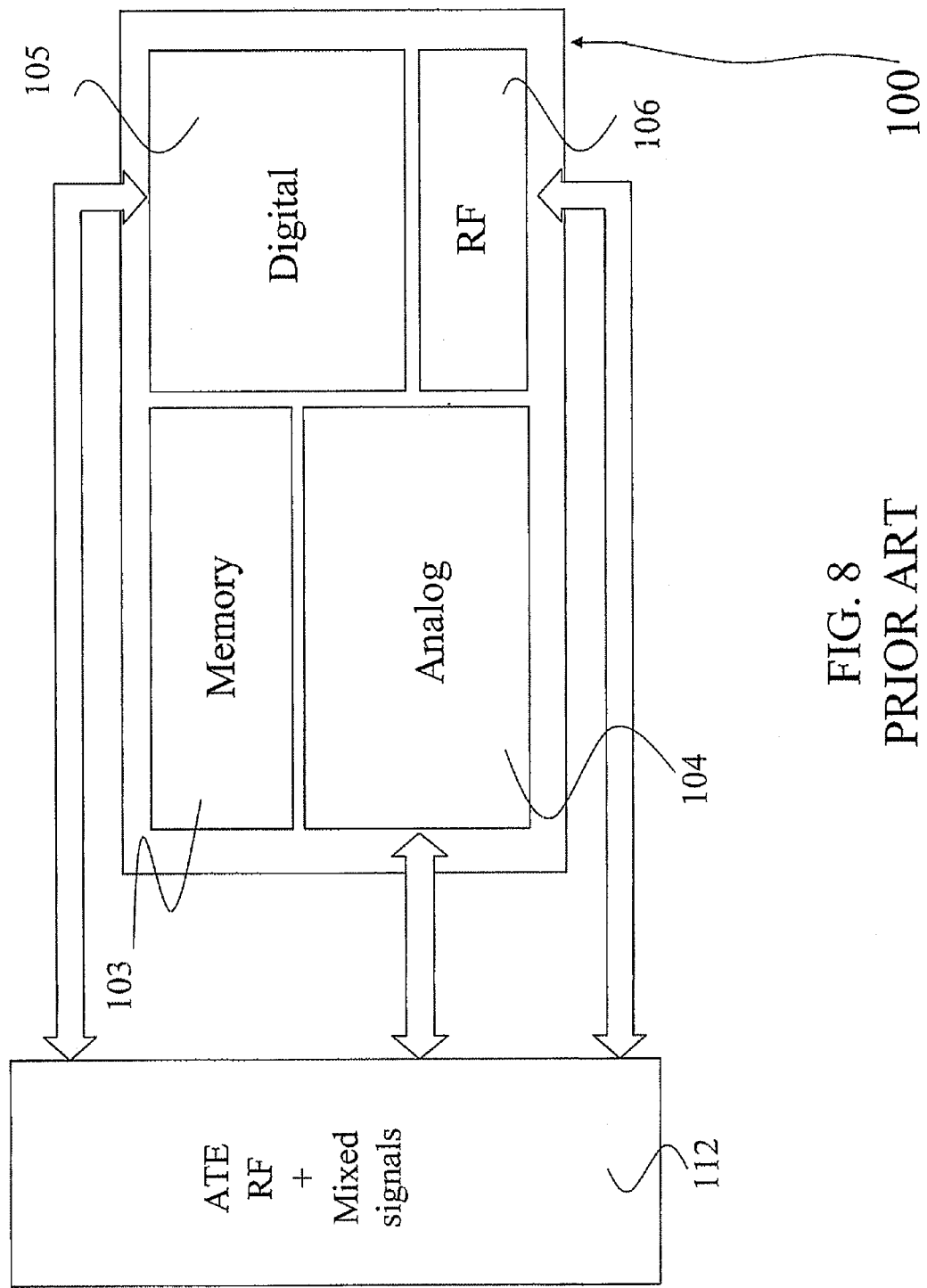
FIG. 8 is a schematic view from above of the complex device DUT connected to a specific ATE for the testing of mixed-signal and radio frequency circuits, according to the prior art.
Figure 9:
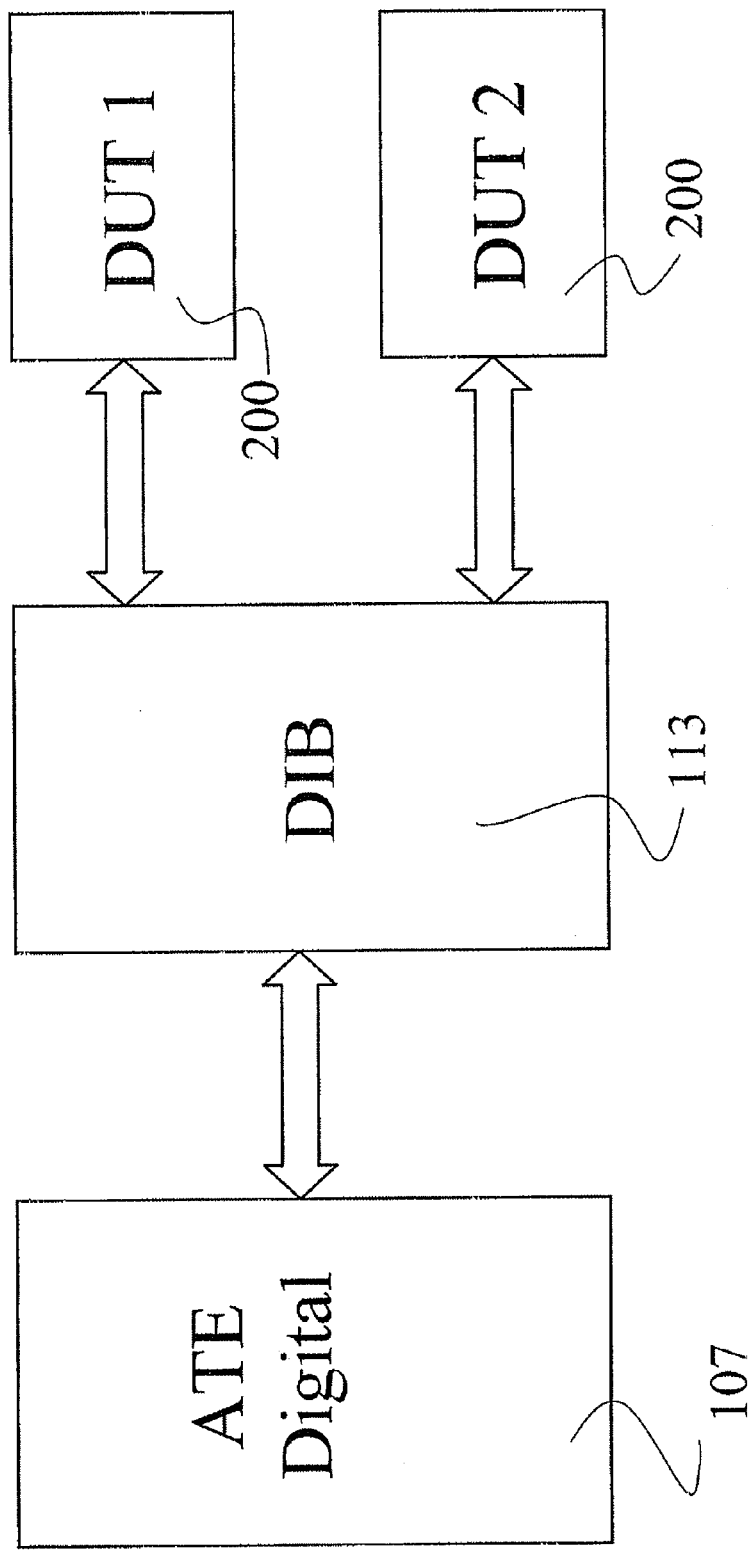
FIG. 9 is a schematic view of a digital ATE connected, by means of a DIB interface, to a first device DUT and to a second device DUT, according to the prior art.
Figure 10:
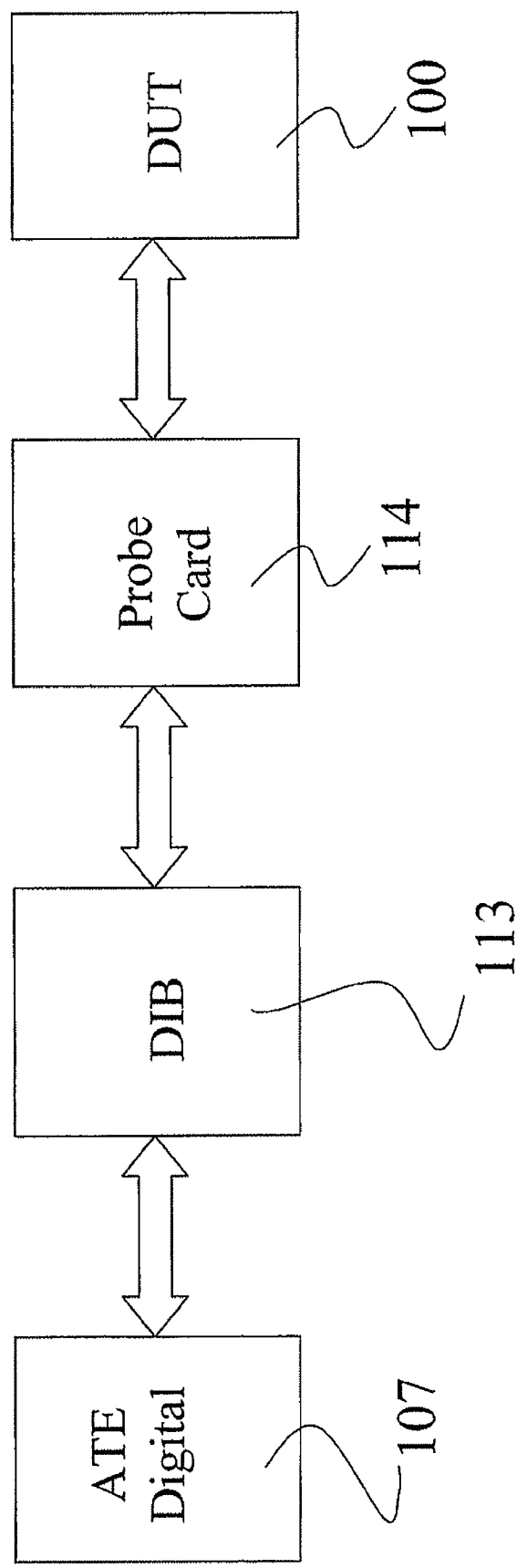
FIG. 10 is a schematic view of a digital ATE connected to a DIB board interfaced with a device DUT by means of a probe card, according to the prior art.

In the following description, certain details are set forth in order to provide a thorough understanding of various embodiments of devices, methods and articles. However, one of skill in the art will understand that other embodiments may be practiced without these details. In other instances, well-known structures and methods associated with DUTs, ATEs and control systems have not been shown or described in detail to avoid unnecessarily obscuring descriptions of the embodiments.

Unless the context requires otherwise, throughout the specification and claims which follow, the word "comprise" and variations thereof, such as "comprising," and "comprises," are to be construed in an open, inclusive sense, that is, as "including, but not limited to."

Reference throughout this specification to "one embodiment," or "an embodiment" means that a particular feature, structure or characteristic described in connection with the embodiment is included in at least one embodiment. Thus, the appearances of the phrases "in one embodiment," or "in an embodiment" in various places throughout this specification are not necessarily referring to the same embodiment, or to all embodiments. Furthermore, the particular features, structures, or characteristics may be combined in any suitable manner in one or more embodiments to obtain further embodiments.

The headings are provided for convenience only, and do not interpret the scope or meaning of this disclosure or the claimed invention.

The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not necessarily intended to convey any information regarding the actual shape of particular elements, and have been selected solely for ease of recognition in the drawings.

With reference to the figures, the steps of embodiments of a method of electrical testing of electronic devices according to the present disclosure are now described. The present disclosure describes a supervised testing method.

Figure 11:
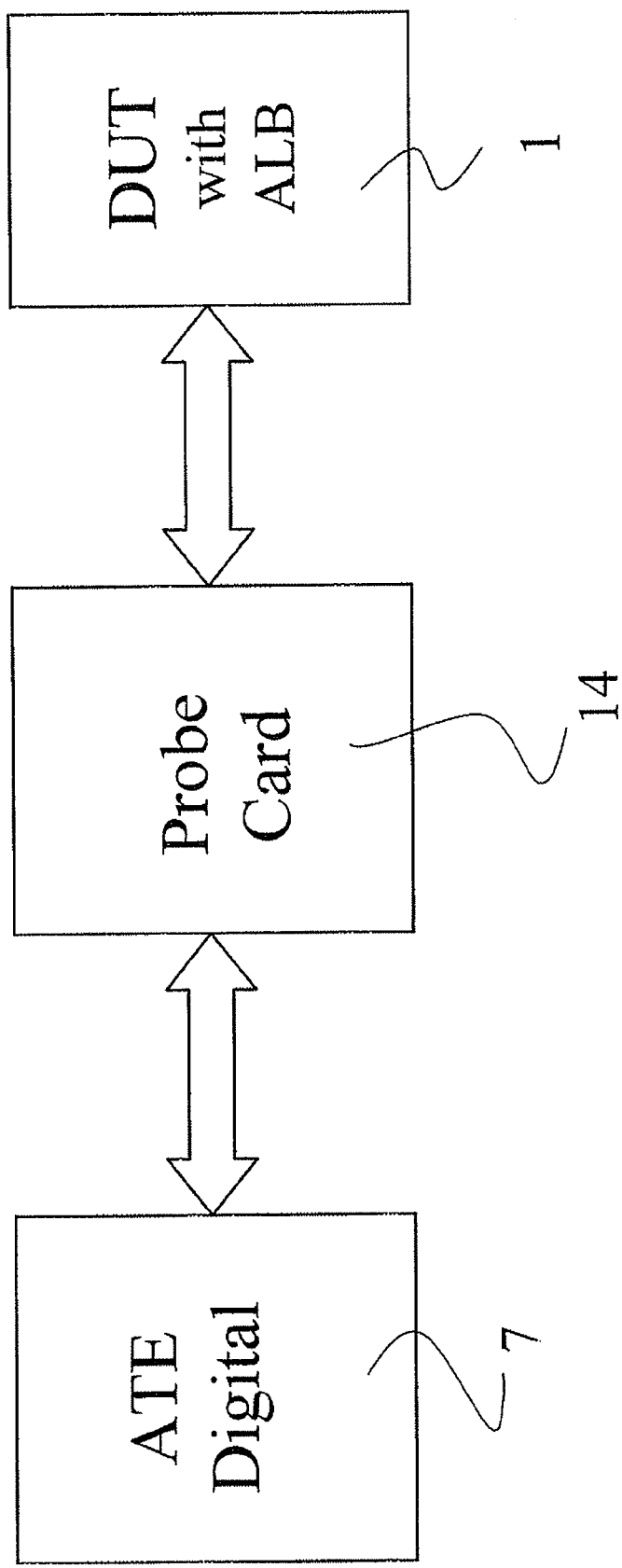
FIG. 11 is a schematic view of a digital ATE connected, by means of a probe card, to a device DUT comprising an ALB system, according to an embodiment.

FIG. 11 is a schematic view of a digital ATE 7 connected, by means of a probe card 14, to a device DUT 1 comprising one advanced supervised self testing system "Advanced Low Pin Count BIST" (ALB). The probe card 14 could be possibly used to provide to the DUT 1 at least part of the power needed for its operation.

Figure 12:
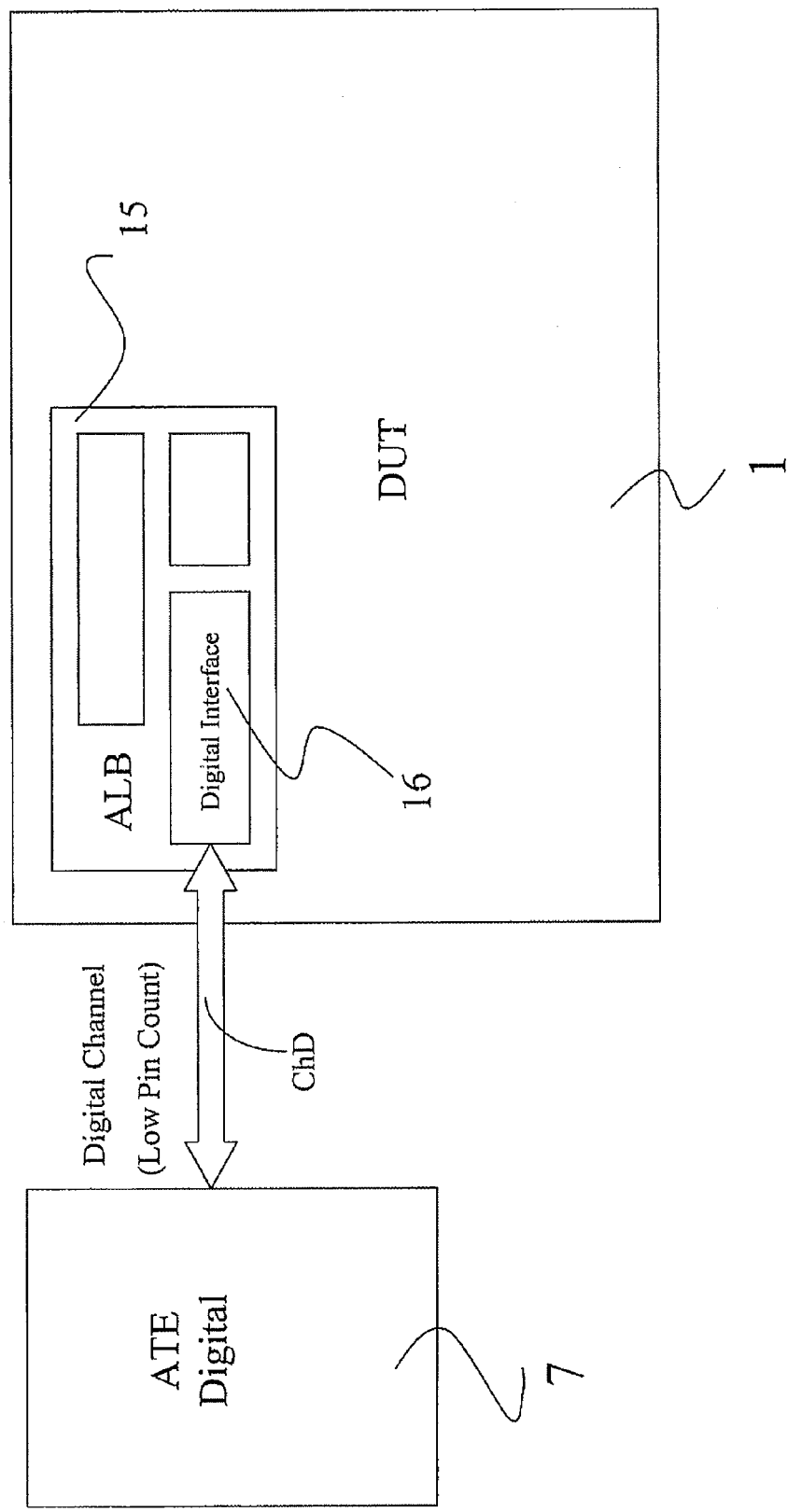
FIG. 12 is a schematic view from above of a digital ATE connected to a generic device DUT comprising an ALB system, according to an embodiment.

More in detail, FIG. 12 is a schematic view from above of the digital ATE 7 connected to the device DUT 1 wherein an ALB system 15 is integrated, comprising in turn a digital interface 16 suitable to create, between the DUT 1 and the digital ATE 7, a mainly or exclusively digital communication channel ChD which, advantageously, can comprise several wired or wireless or partially wired and partially wireless communication lines.

Advantageously, at least one wired communication line can be used as an analog channel and for example it can be connected to the measurement line, Precision Measurement Unit (PMU), commonly comprised in the digital ATE 7, which can be used to perform also measurements and calibrations of the analog type, being thus performed by the analog instrumentation of the digital ATE 7 in the DUT 1. This can be advantageously used when the signals to be provided/measured have small entities, or high-frequency or high value (such as voltages or currents), or when it is not convenient to integrate into the DUT 1 a dedicated circuit for this purpose.

In its most general form, an embodiment of a method for performing an electrical testing of electronic devices DUT 1 comprises the steps of:

connecting at least one DUT 1 to an automatic testing ATE apparatus 7 suitable for performing the testing of digital circuits or memories or of digital circuits and memories; and sending by means of the ATE 7 command signals for the electrical testing to the DUT 1.

Advantageously the method further comprises the steps of:

performing electrical testing of the DUT 1 by means of at least one advanced supervised self testing system of the Advanced Low Pin Count BIST type or ALB system 15 which is built therein and digitally interfaced with the ATE 7 through a dedicated digital communication channel ChD and comprising a limited number of communication or connection lines dedicated to the self testing information exchange; and sending from the DUT 1 toward the ATE 7 reply messages comprising measures, failure information and reply data to command signals by means of the digital communication channel ChD.

It is worth noting that this communication method advantageously applies to any kind of device DUT.

In an embodiment, this communication method also applies in case an ATE is used for memory testing.

In an embodiment, this communication method applies in case an ATE is used for the testing of digital circuits and memories.

In an embodiment, the digital interface 16 can be of the serial or JTAG type.

In an embodiment, the digital interface 16 can comprise one or more buses with data and/or control and/or synchronization lines and/or power lines.

In an embodiment, at least one clock signal can be generated in case within the DUT 1, by using for example a Phase Locked Loop circuit (PLL) of the DUT 1, which can be useful to determine the synchronization between the DUT 1 and the ATE 7.

In an embodiment, the buses being used for the communication can be some internal buses within the device DUT 1 and transmit and receive data by nibbles (4 bits) or bytes (8 bits) or words (16 bits).

In an embodiment, some input and output gates within the DUT 1 can be used as communication lines.

The digital communication between the DUT 1 and the ATE 7 occurs by using a minimum number of lines of the digital channel ChD and, consequently, the interface being created is of the LPC type, i.e., it uses an extremely reduced subset of connections provided by the DUT 1, which are connected to the resources of ATE 7.

Therefore, by means of the ALB system 15 a message exchange occurs between the ATE 7 and the DUT 1. In particular, the ATE 7 sends to the DUT 1 some commands and software SW or firmware FW code, which is executed within the DUT 1, the latter responding to the ATE 7 by sending a suitable failure or error code also comprising failure details, for example internally-made measurements, bitmaps (for the memories), signatures deriving from the digital circuit scanning, or other kinds of data and information.

For example, some measurements made within the DUT 1 can be sent to the ATE 7 by reusing one or more connection lines of the digital channel ChD so that they act in turn as an analog channel and letting then the digital ATE 7 acquire such analog data for example by means of one's own measurement line or other measurement resources.

In an embodiment, measurements being performed within the DUT 1 are sent to the ATE 7 after being digitized by means of at least one Analog-to-Digital Converter (ADC) already realized within the DUT 1, thus reducing the area being necessary for testing circuits, or alternatively by integrating in the chip at least one dedicated ADC.

In an embodiment, at least one analog signal within the DUT 1 being necessary for the testing is generated starting from a sequence of digital information, for example SW/FW algorithms, sent from the ATE 7 toward at least one Digital-to-Analog Converter (DAC) within the DUT 1 thus reducing the area being necessary for testing circuits, or alternatively by integrating in the DUT 1 a dedicated DAC.

In an embodiment, any circuit A being useful for the testing is purposely integrated in the DUT 1 if not already comprised in the DUT itself.

In an embodiment, if a circuit A which is very similar to a circuit B being necessary for the testing is already comprised in the DUT 1, other additional circuits C are integrated in the DUT 1, so that while performing the testing, the circuit A and circuit C concurrently carry out the same functions as circuit B. Moreover, the functions of circuit C can be activated by means of a suitable system, for example by a control digital line, or by programming a flip-flop, activating the test mode working of the system or of the specific circuit. Therefore, circuit A is used for example in the user mode working, while circuit B, obtained by using circuits A and C, is used for example in the test mode working.

Figure 13:
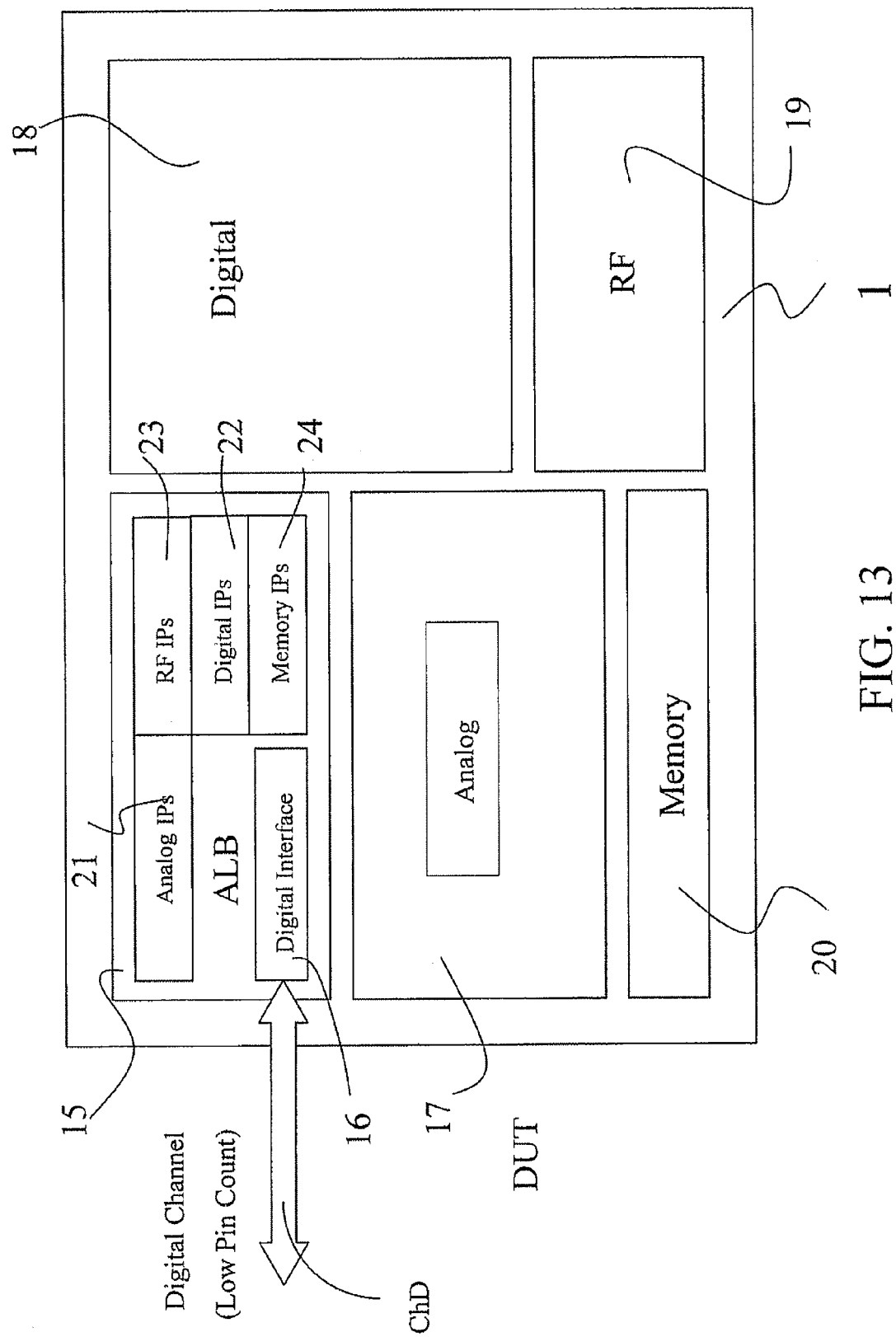
FIG. 13 is a schematic view from above of a complex device DUT comprising an ALB system, according to an embodiment.

Similarly, in order to minimize the excess of area due to the insertion in the DUT 1 of Built-In Self Test (BIST) circuits and of other additional circuits it is necessary to reuse, suitably modifying them, the circuits already comprised in the DUT itself. For this purpose, the ALB system 15 comprises, besides the digital interface 16, also specific testing circuits, the so-called IPs, being dedicated to the testing of circuit blocks of the analog, digital, radio frequency and memory type, or any combination thereof, which can be comprised in a generic device DUT 1. These IPs can be for example BIST circuits; in any case ALB system 15 can use at least a circuit in the DUT 1 as its resource. Only by way of example, FIG. 13 schematizes a complex device DUT 1 comprising circuit blocks of different types and with an integrated ALB system 15, comprising a digital interface 16 being useful to create the communication channel ChD with a digital ATE (not shown in the figure). The DUT 1 comprises an analog circuit block 17, a digital circuit block 18, an RF circuit block 19 and a memory circuit block 20. Moreover, the ALB system 15 comprises, besides the digital interface 16, a plurality of specific IPs for the testing of the different circuit blocks of the DUT 1. In particular, as it is apparent from FIG. 13, the ALB system 15 comprises analog IPs 21, digital IPs 22, RF IPs 23 and memory IPs 24.

Figure 14:
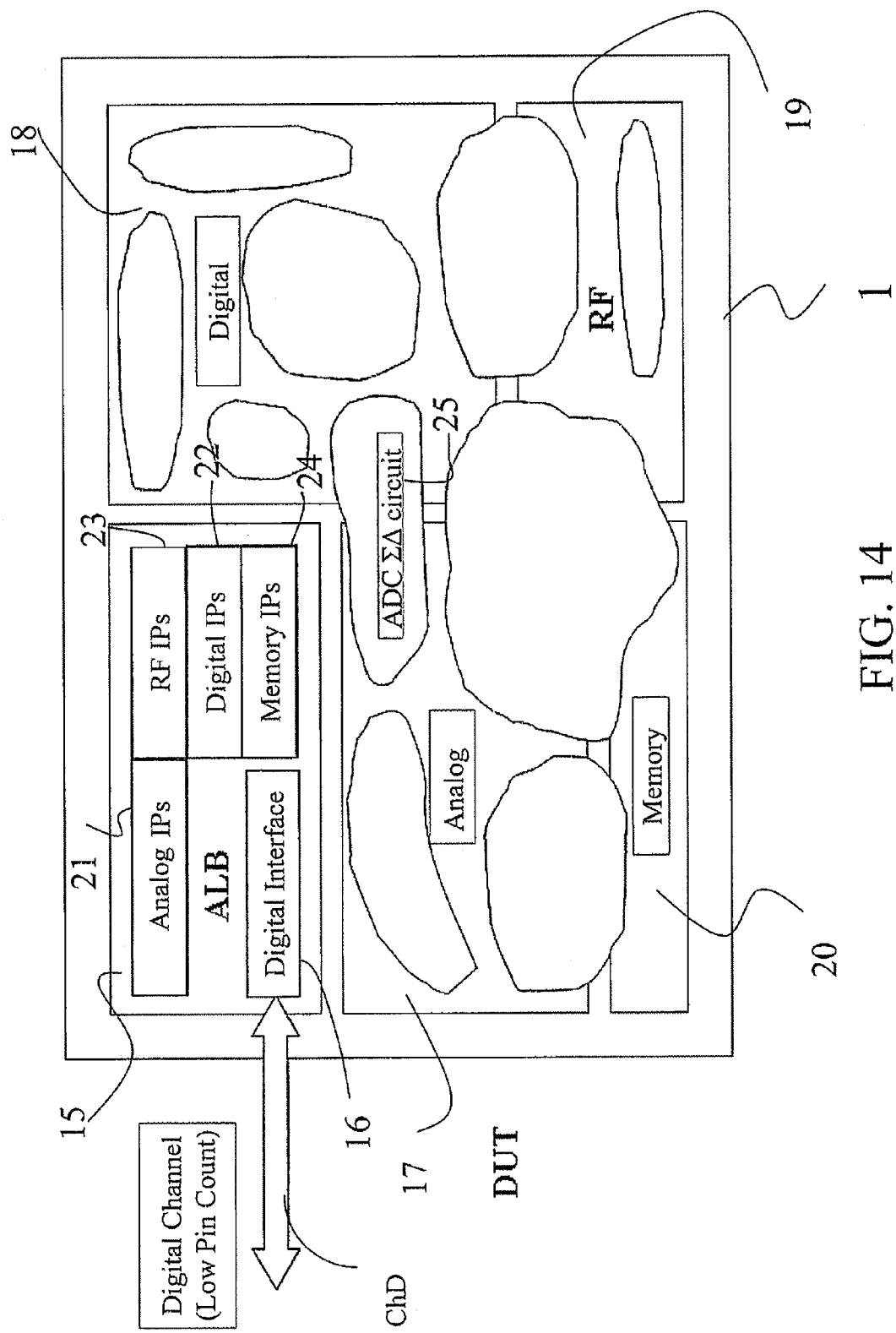
FIG. 14 is a schematic view from above of a complex device DUT comprising an ALB system, according to an embodiment.

In an embodiment, the method also applies to complex devices or systems DUT, indicated with 1, comprising mixed circuit blocks, i.e., partially digital and partially analog, or partially RF, or partially memory or partially other types of circuits. FIG. 14 shows a DUT 1 comprising an ALB system 15, integrated in the device DUT, analog 17, digital 18, RF 19 and memory 20 circuit blocks, and a plurality of mixed circuits, such as for example the ADC ΣΔ circuit 25 which is partially analog and partially digital. In this case, the ALB system 15 comprises, besides a digital interface 16 and analog 21, digital 22, RF 23 and memory 24 IPs, also IPs, not shown in the figure, for the testing of ADC ΣΔ circuit 25 and of other mixed circuits, such as for example a PLL.

Advantageously, just digital circuits can be tested by using the scan compression technique.

Figure 15:
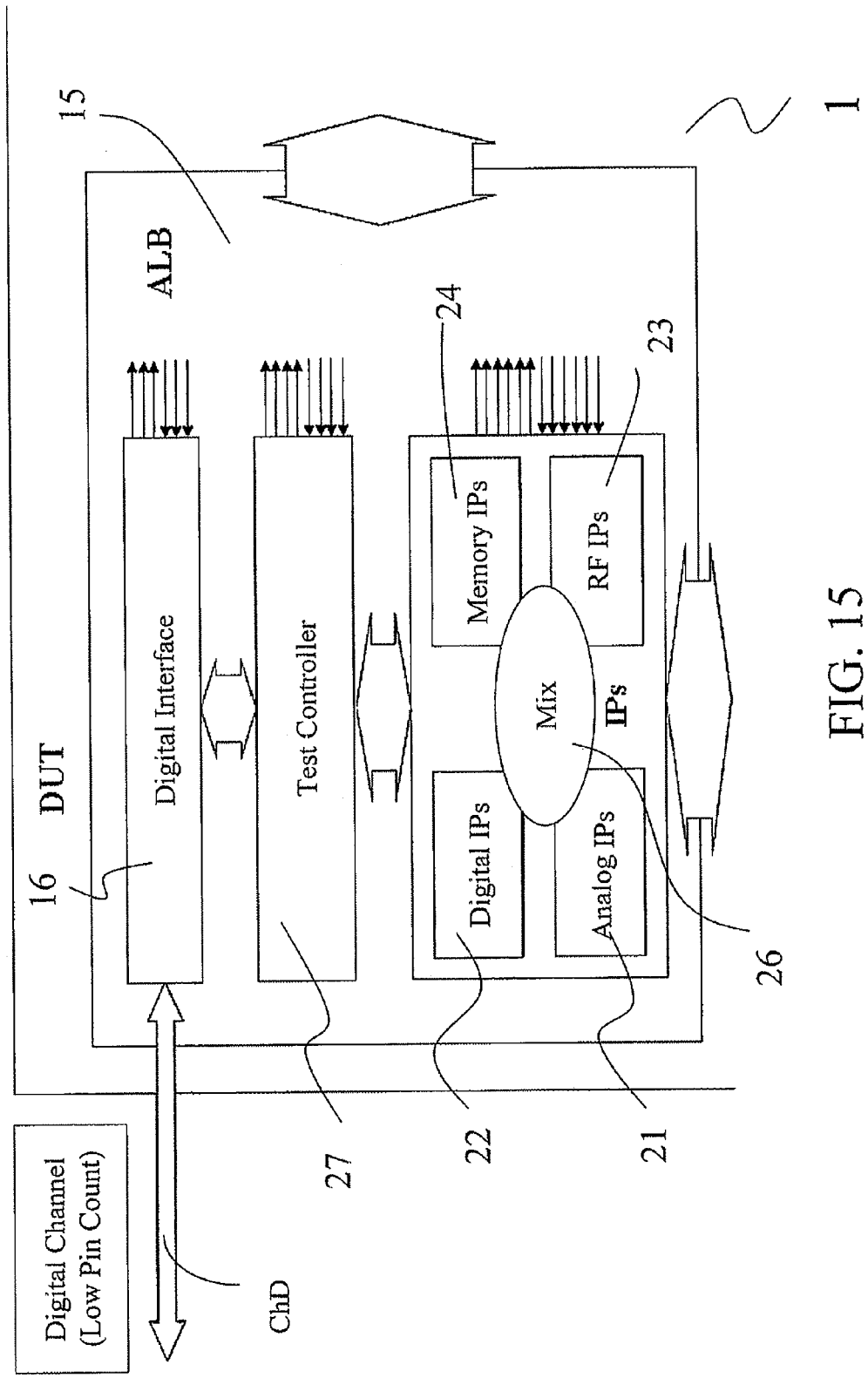
FIG. 15 is a schematic view from above of a device DUT with an ALB system, comprising a Test Controller, according to an embodiment.

In an embodiment, the method also applies to complex devices or systems DUT wherein the ALB system 15 comprises, besides the digital interface 16 and IP circuits, a testing control circuit of the DUT itself. As shown in FIG. 15, an ALB system 15 integrated in the device DUT, indicated with 1, comprises a digital interface 16, a plurality of IPs, as illustrated comprising analog 21, digital 22, RF 23, memory 24, mixed 26 IPs, and a testing control circuit or Test Controller 27 interconnected between the digital interface 16 and the plurality of IPs, the Test Controller 27 acting as a supervisor (master) of the plurality of IPs during the testing.

Then the ATE (not shown) will delegate the testing supervision to the Test Controller 27, and the ATE will operate only in case of request by the Test Controller 27, then the ATE will be used in this way as a resource of Test Controller 27.

Figure 16:
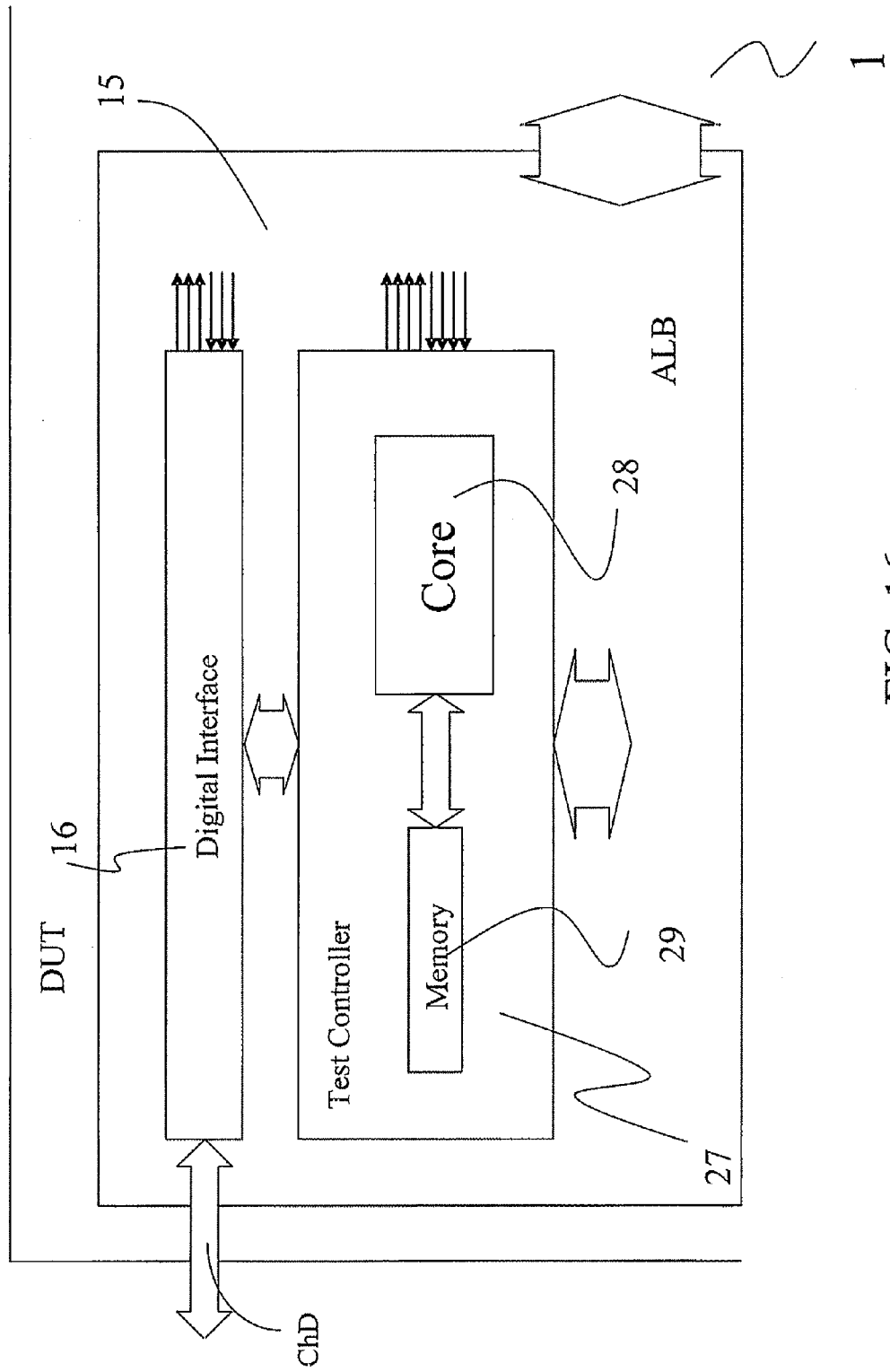
FIG. 16 is a schematic view in greater detail of the Test Controller, according to an embodiment.

In an embodiment, the Test Controller 27 can be, for example, a programmable state machine or alternatively a complex system comprising a microcontroller being dedicated to the ALB system 15 or already comprised in the DUT 1 and reusable for the ALB system 15, or alternatively, as shown in FIG. 16, in general a processing core 28, for example a microprocessor, connected to a memory 29 being dedicated to the ALB system 15 or already comprised in the DUT 1 and reusable for the ALB system 15. The memory 29 comprises the software routines sent by a digital ATE, not shown in the in figure, which are then executed by the Core 28 and by IPs comprised in the ALB system 15 for performing the testing of DUT 1. Then the Test Controller 27 can have computing/elaboration resources that can execute software routines and process data. These IPs are activated and coordinated by the Test Controller 27 and they return thereto some data as the testing result, possible measures and failure details. In case these data can then be converted in the digital form by means of conversion circuits, such as at least one ADC comprised for example in the DUT 1, or, alternatively by means of the measurement resources, for example the measurement line of the digital ATE, or alternately even by using other known conversion techniques.

In an embodiment, the ALB system 15 can be a firmware system, i.e., a hardware system which can be customized by means of a software, and then the ALB system 15 turns out to be a highly flexible system which can be modified by means of a software code, sent for example from the digital ATE 7 toward the DUT 1.

In an embodiment, a single test may be easily modified, being partially or completely performed in the DUT 1, as well as the whole or part of the DUT testing flow. This testing flow comprises a certain number of tests which can be performed partially in series and partially concurrently with each other. In an embodiment, these modifications do not require hardware changes of the DUT 1, for example, since the ALB system 15 is a firmware system.

Figure 17:
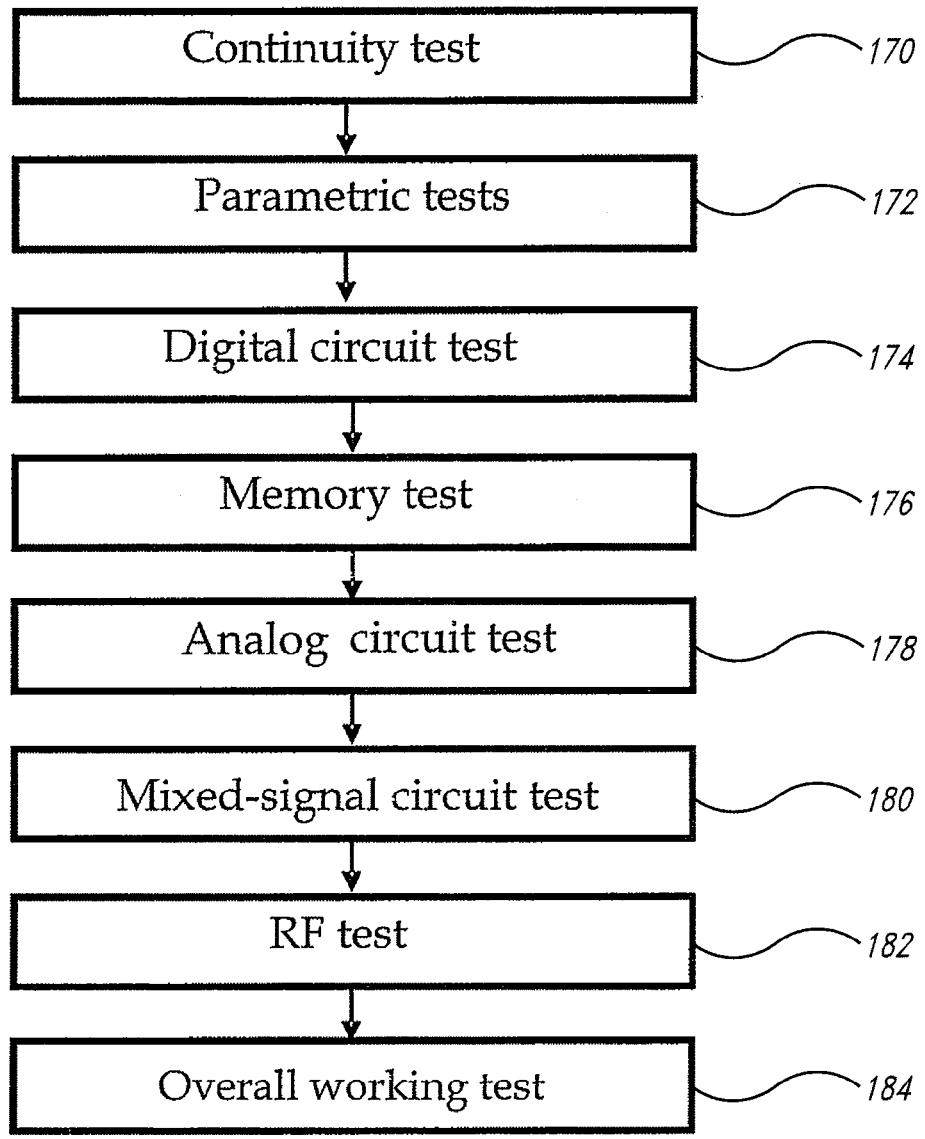
FIG. 17 is a chart of a first testing flow which can be applied to an on-wafer DUT, according to an embodiment.

Only by way of example, FIG. 17 schematizes a first testing flow which can be applied to on-wafer DUTs of the above-described type, according to an embodiment of a method. According to this first testing flow, at first a continuity test 170 (of the probes-pads contact) is performed on the DUT 1; followed by parametric tests 172 performed by the digital tester or by an internal BIST; continuing then with the testing 174 of just digital circuits, also suitable to verify the operation of the Test Controller 27 of the ALB system 15, and testing 176 of the memories; hereafter the just analog, mixed-signal and RF circuits are tested 178, 180, 182; overall working tests 184 are then performed, which are suitable to ensure the operation and the interaction between the different circuit blocks of the DUT 1 as a whole.

In the case of wireless lines, it is possible to provide a transmission-reception test to verify the correct working of these wireless communication or connection lines between the DUT 1 and a remaining part of the testing system.

In an embodiment, the testing flow shown in FIG. 17 can be modified according to specific needs.

It is worth noting that the testing system flexibility in an embodiment is provided by use of the firmware FW type and which can be thus modified by means of a software code SW sent by the ATE 7 and written in the memory 29 of the Test Controller 27.

In an embodiment, for performing a complete testing by means of the ALB system 15, each circuit block of the DUT 1 comprises at least one's own BIST circuit or, alternatively, within the DUT 1 there are the resources for testing the block itself.

In an embodiment, it is possible to test one part of the DUT 1 with the ALB system 15 and another part traditionally.

In an embodiment, the Test Controller 27 can coordinate the test of at least two different circuit blocks. By way of example, if, within the DUT 1, there are a first circuit block B1 and a second circuit block B2 being independent from each other, with the respective BIST circuits to perform a first test on the first circuit block B1 and a second test on the second circuit block B2, being in turn independent from each other too, the Test Controller 27 concurrently activates and coordinates the testing of the circuit blocks B1 and B2 and it waits that the testing ends for sending then to the ATE 7 the results of the first test of the first block B1 and of the second test of the second block B2. In this way a test parallelism is obtained within the DUT 1, due to which it is possible to reduce test times and implement also very articulated test flows. By way of example, the so-obtained internal parallelism allows a pattern to be written in a DUT memory bank and another memory bank to be concurrently erased or, alternatively, independent tests to be concurrently performed for example on the memories and RF circuits.

Figure 18:
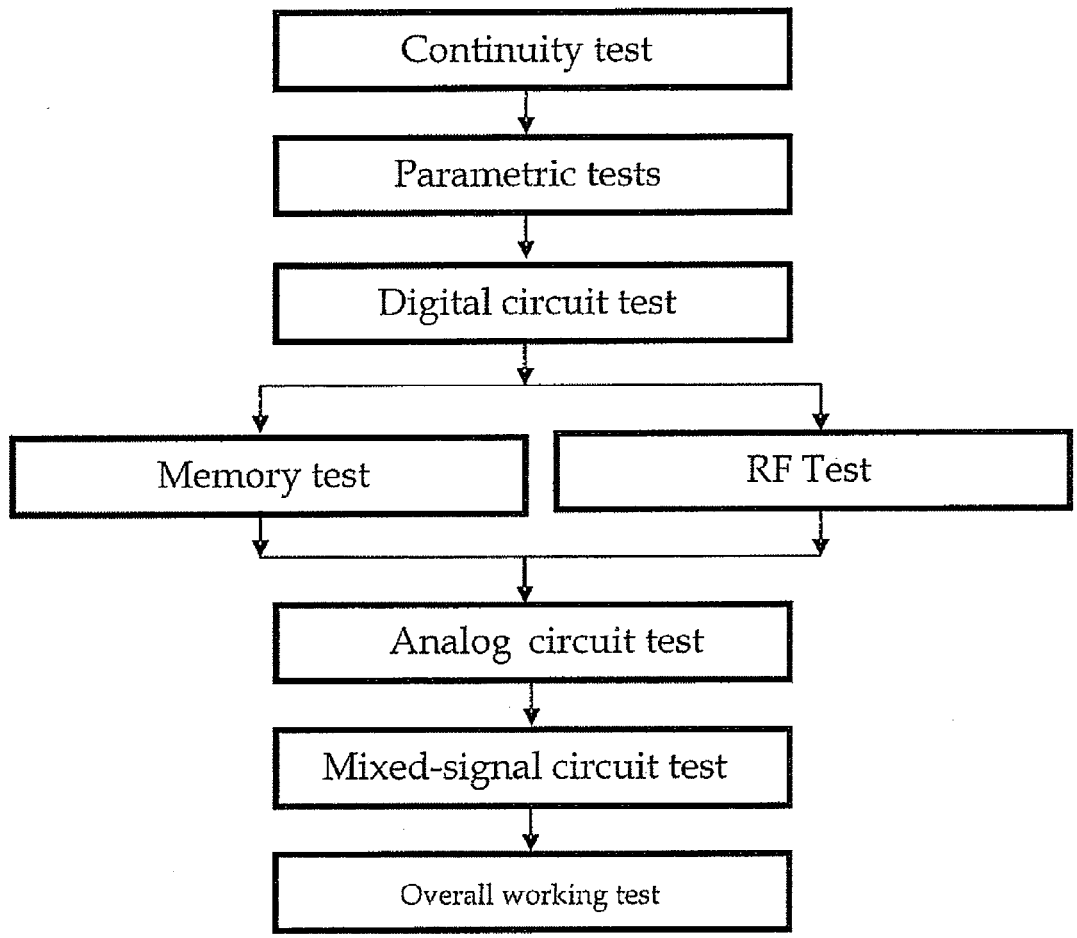
FIG. 18 is the chart of a second testing flow which can be applied to an on-wafer DUT, according to an embodiment.

FIG. 18 schematizes a second testing flow which can be applied to an on-wafer DUT. In particular, this flow differentiates from the one being schematized in FIG. 17 because of the fact of concurrently performing the tests on the memories and RF circuits. In particular, according to the above-described general explanation, the memories and RF circuits correspond to the first and second circuit blocks B1 and B2.

In case the testing flow has a high computational charge, it is possible to transmit the data to the digital ATE 7 connected to the DUT 1. The ATE 7 will thus process these data by means of its processor and resources, finding the desired measures and parameters or the information of interest and concerning the failure. The ATE 7 thus sends to the DUT 1 suitable commands or data being necessary to the Test Controller 27 for continuing the testing. Therefore, in this case a first part of the testing flow is performed within the DUT 1 and a second part is performed by the ATE 7 and, thus, outside the DUT 1. This simplifies the Test Controller 27 so that the processing core 28 comprised therein is not too complex and is thus able to be reused during the normal working of the final application.

Figure 19:
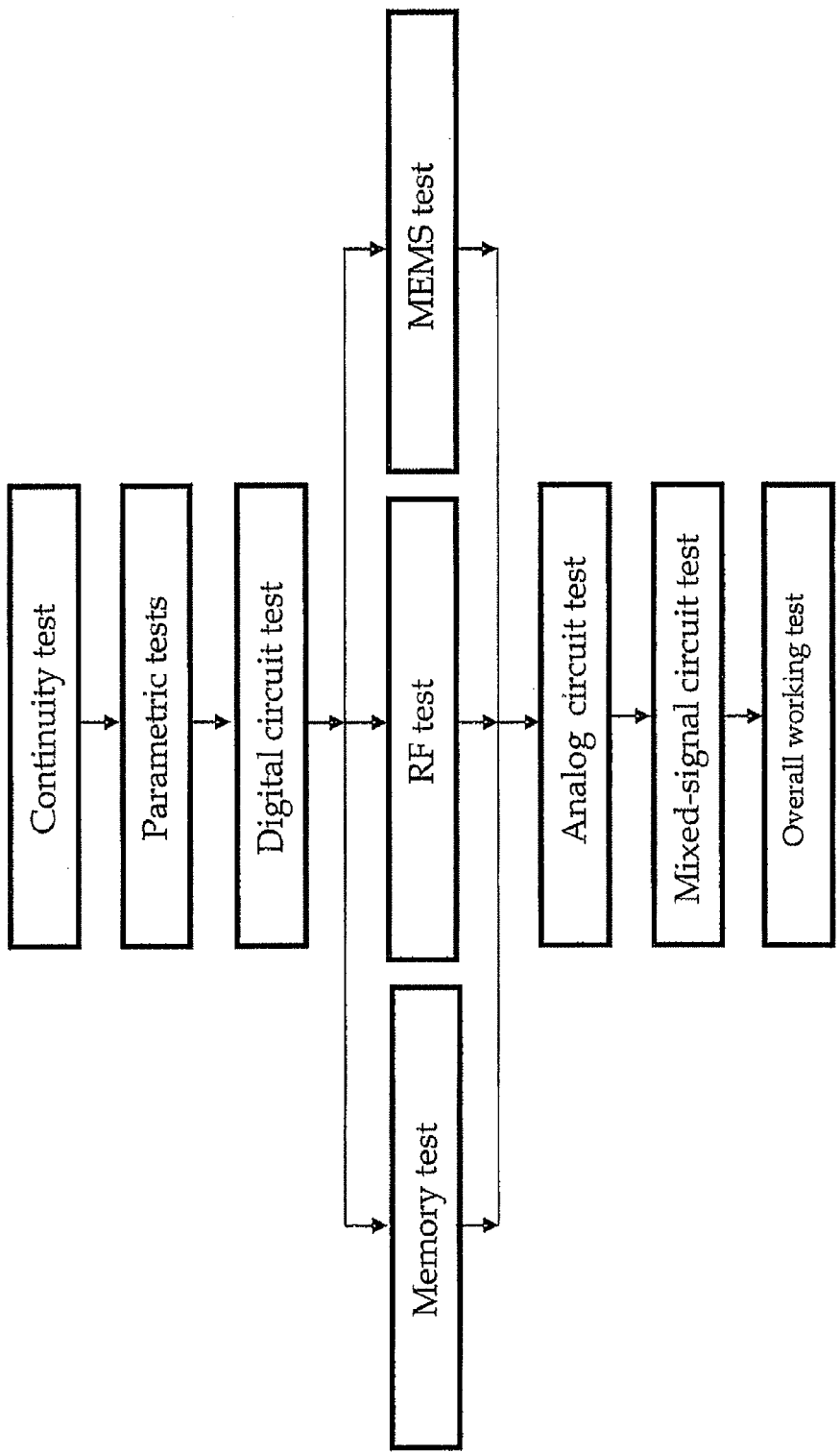
FIG. 19 is the chart of a third testing flow which can be applied to an on-wafer DUT, according to an embodiment.

It should be noted that the second testing flow can be also applied to devices DUT comprising for example MEMS devices with their corresponding BIST circuits or, alternatively, other kinds of subsets. In this case, as shown in FIG. 19, the testing may be concurrently performed on the memories, RF circuits and MEMS devices.

In an embodiment, the supervised testing method can be also applied to encapsulated or "System in Package" (SiP) systems or to electronic systems comprising different kinds of circuits, for which, it is generally difficult to perform a testing evaluating both the system as a whole and the interactions between the different system parts For example, a SiP or a generic complex electronic system comprises a plurality of subsets, for example devices DUT being each equipped with an ALB system comprising in turn a respective digital interface. In this case, it is possible to create a circuit network within the SiP or within the electronic system being useful to connect it to a digital ATE 7 for performing the testing thereof, using the respective testing resources of the different devices DUT comprised therein.

Figure 20:
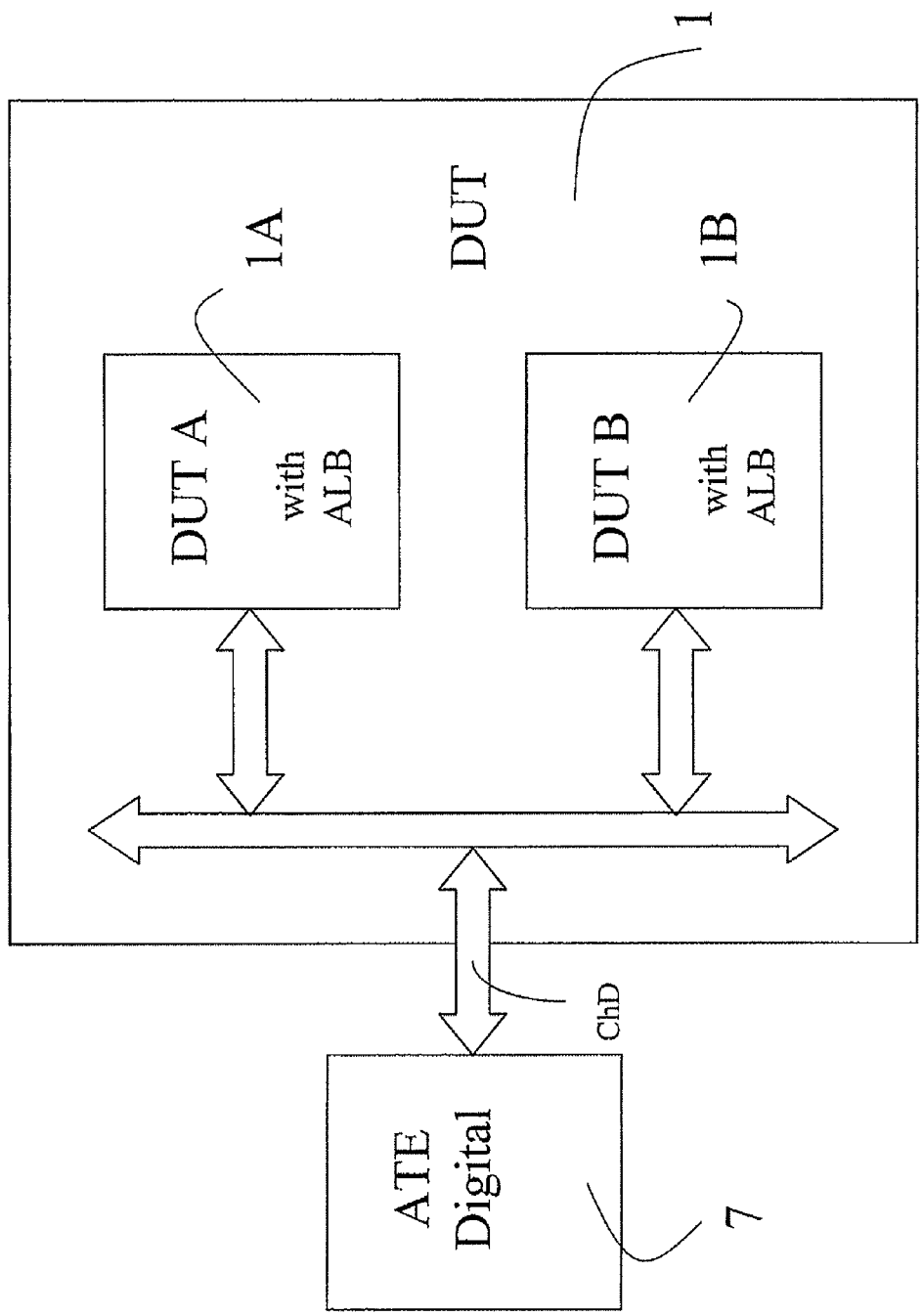
FIG. 20 is a schematic view of a digital ATE connected to a complex device DUT comprising a first DUT with an ALB system and a second DUT with an ALB system, according to an embodiment.

FIG. 20 shows for example an electronic system to be tested, still indicated with DUT 1 and comprising a first device DUT 1A and a second device DUT 1B, each comprising one's own ALB system, both connected to an internal circuit network being useful for the connection to an external digital ATE 7.

Figure 21:
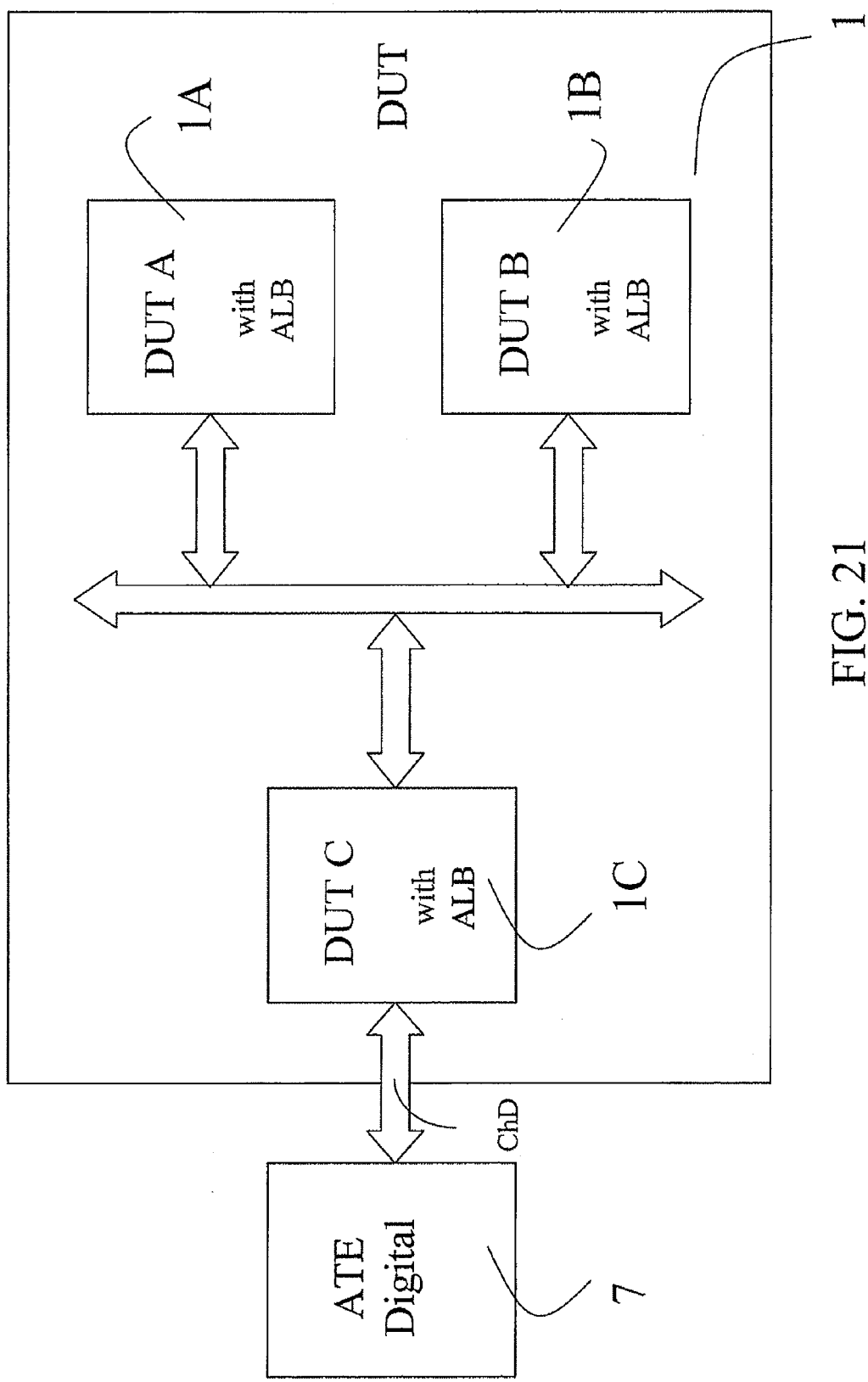
FIG. 21 is a schematic view of a digital ATE connected to a complex device DUT, comprising a first DUT and a second DUT with an ALB system, connected to a third supervisor device DUT, according to an embodiment.

FIG. 21 shows, an embodiment of a complex system DUT, indicated with 1 and comprising a first DUT 1A and a second DUT 1B each comprising one's own ALB system, both connected by means of a connection network to a third device DUT 1C, acting as a supervisor of the system DUT 1 as a whole, connected then in turn to a digital ATE 7.

In an embodiment, the ALB system is used to perform the testing of a generic device DUT or, alternatively, of an anyhow complex system of DUTs.

Figure 22:
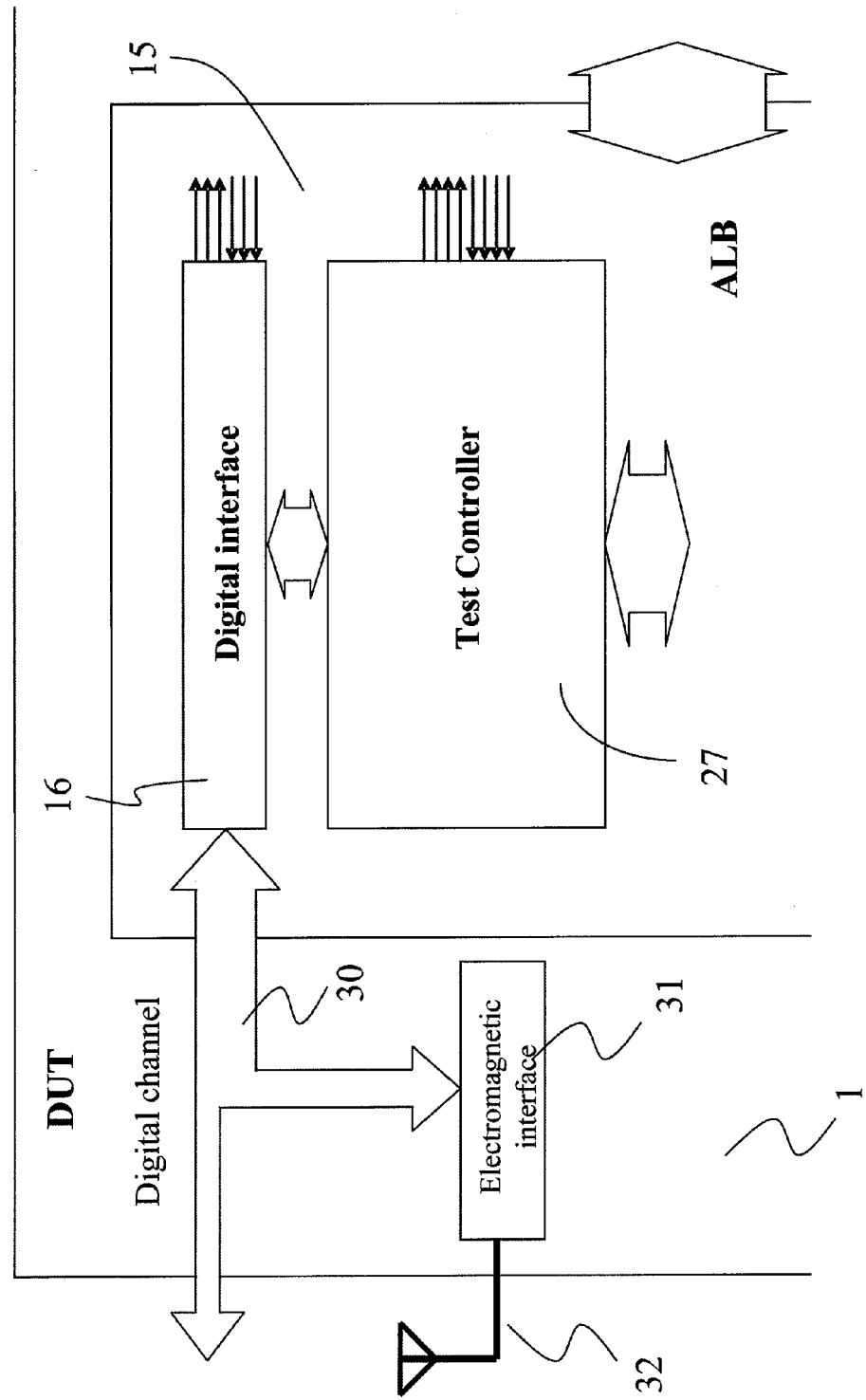
FIG. 22 is a schematic view in greater detail of the Test Controller, according to a third aspect of an alternative embodiment of a device DUT with an ALB system according to an embodiment.

The above becomes even more advantageous considering a further alternative embodiment of the ALB system, as shown in FIG. 22. In particular, according to this alternative embodiment, at least one part of the digital channel (and in some embodiments the whole digital channel) of the digital interface 16 of the ALB 15 of the DUT 1, indicated with 30 in the figure, instead of being directly connected to the ATE (not shown in the figure), is connected to at least one further interface. This at least one further interface, in particular an electromagnetic interface 31 as shown in FIG. 22, can comprise at least one receiving circuit and/or at least one transmitting circuit realized by means of at least one transceiver and/or at least one transponder connected to at least one antenna 32 (external or internal to the DUT 1) which will exchange information by means of electromagnetic waves with a further similar interface, in particular electromagnetic (not shown for convenience of illustration too) connected to the ATE 7.

If the DUT 1 is a low power system, the DUT 1 can have resources to use the power of electromagnetic waves for its work or to provide power at least a part of the DUT 1 circuits. These resources can be embedded in the electromagnetic interface 31, and they can be for example an AC/DC converter.

In an embodiment, it is possible to consider an information exchange by means of at least one optical or optoelectronic interface (not shown for convenience of illustration).

In an embodiment, it is possible to use at least one electromagnetic and/or optoelectronic interface.

In conclusion, the method according to an embodiment thus allows the testing (EWS or the like) of a device DUT to be easily performed by means of a mainly digital communication channel between a digital ATE and the DUT itself, by using a reduced number of connection lines due to a digital interface of the LPC type. The number of DUT connections to be connected to ATE resources for DUT testing is thus reduced, and thus also the number of ATE resources to be used. Consequently, the testing cost is considerably reduced, while the testing parallelism is increased.

An advantage of an embodiment of the supervised testing method using a programmable Test Controller, for example a system of the firmware type, consists in the testing strategy flexibility.

It is thus possible, in an embodiment to test digital, analog, RF, memory, MEMS circuits or of a different type, also including the corresponding BIST circuits in the whole system to be tested. Therefore, a digital ATE can also test non-digital circuits due to the BIST circuits and to other interfaces interposed between the DUT and the ATE. An embodiment uses a single type of ATE, in particular a digital ATE having a lower cost than the others, for testing a complex DUT, with a subsequent reduction in the test cost and complexity.

Moreover, the presence of BIST circuits, on one hand complicating the DUT design, advantageously allows the parasites of the measurement chain to be reduced, thus solving production problems due to the variability of the parasites themselves and of the elements of the measurement chain outside the DUT.

A further advantage of an embodiment of the method is performing the concurrent testing of different and independent circuit blocks.

Moreover, the use of a digital ATE allows digital processing of the data acquired by the DUT to be performed, thus simplifying the processing core comprised in the Test Controller.

In an embodiment, the ALB system comprises a digital interface of the LPC type allowing the testing parallelism to be increased, with a subsequent reduction of test costs and times. Therefore, for testing on-wafer DUTs the problems linked to the bonding step, during the assembly, are reduced, which are due to the pads damaging caused by the probes contacting the pads themselves for performing the electrical testing. Using the above-described method, it is also possible to reduce the area occupied by the pads on the device as a whole.

In this way, a high level of standardization in the testing process of chips, SiPs and, more generally, more or less complex electronic systems may be obtained.

Moreover, the internal communication network which is created in SiPs and in electronic systems can be also used by an external user in the application and for the testing of the whole system.

An embodiment can be advantageously also used for SiPs and, in any case, for a generic system comprising a plurality of DUTs and anyhow complex.

Some embodiments may take the form of or comprise computer program products. For example, according to one embodiment there is provided a computer readable medium comprising a computer program adapted to perform one or more of the methods or functions described above. The medium may be a physical storage medium such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the systems and/or modules may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. All of the U.S. patents, U.S. patent application publications, U.S. patent application, foreign patents, foreign patent application and non-patent publications referred to in this specification and/or listed in the Application Data Sheet are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of testing electronic devices DUT, the method comprising:
    connecting, using a dedicated digital communication channel, at least one electronic device DUT to an automatic testing apparatus ATE configured to perform testing of at least one of digital circuits and memories, the at least one electronic device DUT including a processor core and a testing module;
    sending electrical testing command signals to the at least one electronic device DUT from the ATE through the dedicated digital communication channel;
    loading the electrical testing command signals in the testing module of the at least one electronic device DUT;
    performing electrical testing of the at least one electronic device DUT under control of programmable circuitry of the testing module of the at least one electronic device DUT and based on the loaded electrical testing command signals, wherein the performing electrical testing includes execution by the processor core at least some of the loaded testing command signals and execution by the testing module of at least some of the loaded electrical testing command signals; and
    sending reply messages from the testing module of the at least one electronic device DUT to the ATE through the dedicated digital communication channel.

2. The method of claim 1, further comprising:
    generating a clock signal in the at least one electronic device DUT; and
    synchronizing the at least one electronic device DUT and the ATE based on the generated clock signal.

3. The method of claim 1 wherein the testing module of the at least one electronic device comprises an analog to digital converter, the method further comprising:
    converting analog data to digital data using the analog to digital converter; and
    transmitting the converted analog data from the at least one electronic device DUT to the ATE through the dedicated digital communication channel.

4. The method of claim 1 wherein the performing electrical testing includes performing testing by at least one circuit which is integrated into the at least one electronic device DUT.

5. The method of claim 1 wherein the performing electrical testing includes using a first circuit of the electronic device DUT which is functionally similar to a structured circuit to perform the testing together with a second testing circuit which is integrated into the electronic device DUT, the first and second circuits together carrying out a same function as a function of the structured circuit.

6. The method of claim 1 wherein the at least one electronic device comprises user mode circuitry and test mode circuitry, the method further comprising configuring a first functional block of the user mode circuitry and a second functional block of the test mode circuitry to jointly perform a test mode function.

7. The method of claim 6, further comprising:
    an activation step of the first functional block in user mode.

8. The method of claim 1 wherein at least one testing step is performed partially inside and partially outside the electronic device DUT.

9. The method of claim 8 wherein the at least one testing step is performed under control of the testing module by processing data using hardware and/or software resources of the ATE apparatus.

10. The method of claim 1 wherein the programmable circuitry comprises at least one of:
    a programmable state machine;
    a microcontroller and a memory coupled to the microcontroller;
    a processing core and a memory coupled to the processing core; and
    firmware configured to be modifiable by the digital electrical testing command signals.

11. A method of testing electronic devices DUT, the method comprising:
    connecting, using a dedicated digital communication channel, at least one electronic device DUT to an automatic testing apparatus ATE configured to perform testing of at least one of digital circuits and memories, the at least one electronic device DUT including user mode circuitry and test mode circuitry;
    sending electrical testing command signals to the at least one electronic device DUT from the ATE through the dedicated digital communication channel;
    loading the electrical testing command signals in a testing module of the at least one electronic device DUT;
    performing electrical testing of the at least one electronic device DUT under control of programmable circuitry of the testing module of the at least one electronic device DUT and based on the loaded electrical testing command signals;
    configuring a first functional block of the user mode circuitry and a second functional block of the test mode circuitry to jointly perform a test mode function;
    an activation step of the first functional block in user mode;
    an activation step of the second functional block in test mode using at least one of a control digital line and a flip-flop; and
    sending reply messages from the testing module of the at least one electronic device DUT to the ATE through the dedicated digital communication channel.

12. A method of testing electronic devices DUT, the method comprising:
    connecting, using a dedicated digital communication channel, at least one electronic device DUT to an automatic testing apparatus ATE configured to perform testing of at least one of digital circuits and memories;

sending electrical testing command signals to the at least one electronic device DUT from the ATE through the dedicated digital communication channel;

loading the electrical testing command signals in a testing module of the at least one electronic device DUT;

performing electrical testing of the at least one electronic device DUT under control of programmable circuitry of the testing module of the at least one electronic device DUT and based on the loaded electrical testing command signals; and sending reply messages from the testing module of the at least one electronic device DUT to the ATE through the dedicated digital communication channel, wherein the performing electrical testing comprises:

performing at least one of a continuity test and a transmission-reception test to verify communication with the at least one electronic device DUT;

performing parametric testing to measure at least one of a voltage and a current of the at least one electronic device DUT;

performing testing of at least one of:
  a digital block;
  a memory block;
  an analog block;
  a mixed signal block;
  a radio frequency block; and
  a MEMS device; and performing testing steps related to a working of the at least one electronic device DUT.

13. The method of claim 12 wherein at least two blocks are tested and some of the testing steps of the two blocks are carried out in parallel.

14. A method of testing electronic devices DUT, the method comprising:

connecting, using a dedicated digital communication channel, at least one electronic device DUT to an automatic testing apparatus ATE configured to perform testing of at least one of digital circuits and memories;

sending electrical testing command signals to the at least one electronic device DUT from the ATE through the dedicated digital communication channel;

loading the electrical testing command signals in a testing module of the at least one electronic device DUT;

performing electrical testing of the at least one electronic device DUT under control of programmable circuitry of the testing module of the at least one electronic device DUT and based on the loaded electrical testing command signals; and sending reply messages from the testing module of the at least one electronic device DUT to the ATE through the dedicated digital communication channel, wherein the performing electrical testing comprises performing stress and temperature testing of a wafer level burn-in.

15. An electronic device, comprising:
at least one functional module;
a processor core;
a digital signal interface configured to communicatively couple the electronic device to an automatic testing apparatus through a dedicated digital communication channel; and
a testing module communicatively coupled to the digital signal interface and including programmable circuitry configured to:
  load digital electrical testing command signals received from the automatic testing apparatus;
  control testing of the at least one functional module based on the loaded digital electrical testing command signals; and
  generate and send testing result digital signals to the digital signal interface for transmission to the automatic testing apparatus, wherein the processor core is configured to execute at least some of the loaded digital electrical testing command signals.

16. The electronic device according to claim 15 wherein the at least one functional module comprises at least one of:
  a digital block;
  a memory block;
  a radio frequency block;
  a MEMS device;
  an analog block; and
  a mixed signal block.

17. The electronic device of claim 15 wherein the digital signal interface comprises at least one of:
  an electromagnetic interface;
  an optoelectronic interface; and
  a digital signal bus interface.

18. The electronic device according to claim 15 wherein the testing module comprises a plurality of built-in-self-test modules comprising at least one of:
  a module configured to test an analog functional block of the electronic device;
  a module configured to test a digital functional block of the electronic device;
  a module configured to test a radio frequency functional block of the electronic device;
  a module configured to test a memory of the electronic device;
  a module configured to test a mixed signal block of the electronic device; and
  a module configured to test a MEMS device of the electronic device.

19. The electronic device of claim 18 wherein the testing module is configured to test the radio frequency functional block and the memory of the electronic device in series.

20. The electronic device according to claim 15 wherein the digital signal interface comprises a bus interface having at least one of:
  a digital interface of a low pin count type;
  a digital interface of a serial type; and
  a digital interface of a JTAG type.

21. The electronic device according to claim 15 wherein the testing module comprises:
  a plurality of built-in-self-test modules; and
  a controller coupled to the digital signal interface and the plurality of built-in-self-test modules and configured to control set up of a testing mode of the electronic device.

22. The electronic device according to claim 15 wherein the programmable circuitry of the testing module comprises at least one of:
  a programmable state machine;
  a microcontroller and a memory coupled to the microcontroller;
  a processing core and a memory coupled to the processing core; and
  firmware configured to be modifiable by the digital electrical testing command signals.

23. The device of claim 15 wherein the testing module is configured to selectively use a resource of the automatic testing apparatus during performance of a test.

24. An electronic device, comprising:
a memory;
a processor core;

at least one functional module;
a digital signal interface configured to communicatively couple the electronic device to an automatic testing apparatus through a dedicated digital communication channel; and
a testing module communicatively coupled to the digital signal interface and configured to:
load digital electrical testing command signals received from the automatic testing apparatus;
control testing of the at least one functional module based on the loaded digital electrical testing command signals; and
generate and send testing result digital signals to the digital signal interface for transmission to the automatic testing apparatus, wherein:
the testing module comprises at least one built-in-self-test module;
the memory is configured to store the digital electrical testing command signals;
the processor core and the at least one built-in-self-test module are configured to execute the stored command signals; and
the at least one built-in-self-test module is configured to generate the testing result digital signals.

25. The electronic device of claim 24 wherein the memory is a memory of the functional module of the electronic device.

26. A system comprising:
an automatic testing apparatus configured to generate digital test command signals; and
a plurality of electronic devices, each having:
a processor core;
one or more functional modules;
a digital signal bus interface configured to communicatively couple the electronic device to the automatic testing apparatus; and
a testing module communicatively coupled to the digital signal bus interface, the processor core and at least one of the one or more functional modules of the electronic device and having programmable circuitry configured to set up and control a test mode of operation of the electronic device based on the digital test command signals, wherein the processor core is configured to execute at least some of the digital test command signals and the testing module is configured to execute at least some instructions based on the digital test command signals.

27. The system of claim 26 wherein the plurality of electronic devices each further comprises at least one digital to analog converter configured to create at least one analog signal in the corresponding electronic device based on the digital test command signals.

28. An electronic device, comprising:
at least one functional module;
a processor core;
a digital signal bus interface configured to communicatively couple the electronic device to an automatic testing apparatus through a dedicated digital communication channel; and
a testing module communicatively coupled to the digital signal bus interface and having programmable circuitry configured to:
set up a test mode of operation of the electronic device based on digital electrical testing command signals received from the automatic testing apparatus through the dedicated digital communication channel;
control testing of the at least one functional module in the test mode of operation, wherein the testing includes causing the processor core to execute at least some instructions included in the digital electrical testing command signals; and
control generation and sending of testing result signals to the digital signal bus interface.

29. The electronic device of claim 28, further comprising:
a digital to analog converter configured to generate an analog signal in the electronic device during the testing of the at least one functional module.

30. A system comprising:
an automatic testing apparatus configured to generate digital test command signals; and
an electronic device, having:
a first functional module;
a second functional module;
a digital signal bus interface configured to communicatively couple the electronic device to the automatic testing apparatus;
a first programmable testing module communicatively coupled to the digital signal bus interface and the first functional module and configured to set up and execute a test mode of operation of the electronic device based on the digital test command signals;
a second testing module; and
a digital signal communication channel configured to communicatively couple the first testing module to the second testing module, wherein the first testing module is configured as a master testing module, wherein the first functional module is a memory module and the second functional module is a radio-frequency module and the electronic device is configured to test the first and second functional modules in parallel.

31. The system of claim 30 wherein the first testing module is configured to selectively use a resource of the automatic testing apparatus during performance of a test.

32. An electronic device, comprising:
at least one functional module;
a digital signal interface configured to communicatively couple the electronic device to an automatic testing apparatus through a dedicated digital communication channel; and
a testing module communicatively coupled to the digital signal interface and including programmable circuitry configured to:
load digital electrical testing command signals received from the automatic testing apparatus;
control testing of the at least one functional module based on the loaded digital electrical testing command signals; and
generate and send testing result digital signals to the digital signal interface for transmission to the automatic testing apparatus, wherein the testing module comprises a plurality of built-in-self-test modules including a module configured to test a radio frequency functional block of the electronic device and a module configured to test a memory of the electronic device, and the testing module is configured to test the radio frequency functional block and the memory of the electronic device in parallel.

* * * * *